(12) United States Patent
Michaluk et al.

(10) Patent No.: US 7,431,782 B2
(45) Date of Patent: Oct. 7, 2008

(54) HIGH PURITY TANTALUM, PRODUCTS CONTAINING THE SAME, AND METHODS OF MAKING THE SAME

(75) Inventors: Christopher A. Michaluk, Gilbertsville, PA (US); Louis E. Huber, Allentown, PA (US); Mark N. Kawchak, Phoenixville, PA (US); James D. Maguire, Jr., Norristown, PA (US)

(73) Assignee: Cabot Corporation, Boston, MA (US)

( * ) Notice: Subject to any disclaimer, the term of this patent is extended or adjusted under 35 U.S.C. 154(b) by 385 days.

(21) Appl. No.: 10/145,336

(22) Filed: May 14, 2002

(65) Prior Publication Data

US 2003/0037847 A1 Feb. 27, 2003

Related U.S. Application Data

(63) Continuation of application No. 09/922,815, filed on Aug. 6, 2001, which is a continuation of application No. 09/199,569, filed on Nov. 25, 1998, now Pat. No. 6,348,113.

(51) Int. Cl.
C22F 1/18 (2006.01)
C22B 3/44 (2006.01)
C22B 9/04 (2006.01)

(52) U.S. Cl. .............................. 148/668; 148/DIG. 158

(58) Field of Classification Search ................. 148/422, 148/688, DIG. 158, DIG. 14, 668; 420/427
See application file for complete search history.

(56) References Cited

U.S. PATENT DOCUMENTS 2,516,863 A 8/1950 Gardner (Continued)

FOREIGN PATENT DOCUMENTS

AU 252442 6/1960

(Continued)

OTHER PUBLICATIONS

ASM International Handbook Committee, "Metals Handbook, 9th edition, vol. 14: Forming and Forging", ASM International, Nov. 1993, pp. 145-149.*

(Continued)

Primary Examiner—Sikyin Ip

(57) ABSTRACT

High purity tantalum metals and alloys containing the same are described. The tantalum metal preferably has a purity of at least 99.995% and more preferably at least 99.999%. In addition, tantalum metal and alloys thereof are described, which either have a grain size of about 50 microns or less, or a texture in which a (100) intensity within any 5% increment of thickness is less than about 15 random, or an incremental log ratio of (111):(100) intensity of greater than about −4.0, or any combination of these properties. Also described are articles and components made from the tantalum metal which include, but are not limited to, sputtering targets, capacitor cans, resistive film layers, wire, and the like. Also disclosed is a process for making the high purity metal which includes the step of reacting a salt-containing tantalum with at least one compound capable of reducing this salt to tantalum powder and a second salt in a reaction container. The reaction container or liner in the reaction container and the agitator or liner on the agitator are made from a metal material having the same or higher vapor pressure of melted tantalum. The high purity tantalum preferably has a fine and uniform microstructure.

30 Claims, 11 Drawing Sheets

U.S. PATENT DOCUMENTS

| | | | |
|---|---|---|---|
| 2,950,185 A | 9/1960 | Hellier et al. | 75/363 |
| 2,992,095 A | 7/1961 | Li | 75/27 |
| 3,085,871 A | 4/1963 | Griffiths | 75/34.1 |
| 3,110,585 A | 11/1963 | Scheller et al. | 75/84.5 |
| 3,268,328 A | 8/1966 | Torti, Jr. | 75/174 |
| 3,335,037 A | 8/1967 | Dunn et al. | 148/668 |
| 3,497,402 A | 2/1970 | Douglass et al. | 148/668 |
| 3,597,192 A | 8/1971 | Wilhelm et al. | 45/84 |
| 3,647,420 A | 3/1972 | Restelli | 75/84 |
| 3,653,850 A | 4/1972 | Eberts | 23/312 |
| 3,878,079 A | 4/1975 | Schauer | 204/192 |
| 3,925,187 A | 12/1975 | Bernard | 204/298 |
| 3,955,039 A | 5/1976 | Roschy et al. | 428/457 |
| 4,032,328 A | 6/1977 | Hurd | 75/395 |
| 4,141,719 A | 2/1979 | Hakko | 75/0.5 |
| 4,231,790 A | 11/1980 | Hahn et al. | 75/0.5 |
| 4,490,340 A | 12/1984 | Ritsko et al. | 423/65 |
| 4,600,448 A | 7/1986 | Schmidt et al. | 148/407 |
| 4,619,695 A | 10/1986 | Oikawa et al. | 75/65 EB |
| 4,673,554 A | 6/1987 | Niwa et al. | 423/63 |
| 4,684,399 A | 8/1987 | Bergman et al. | |
| 4,727,928 A | 3/1988 | DeVynck et al. | 164/469 |
| 4,786,468 A | 11/1988 | Wang et al. | 420/427 |
| 4,842,706 A | 6/1989 | Fukasawa et al. | 204/298 |
| 4,844,746 A * | 7/1989 | Hormann et al. | 148/557 |
| 4,877,445 A | 10/1989 | Okudaira et al. | 75/0.5 |
| 4,960,163 A | 10/1990 | Fang et al. | 164/459 |
| 5,013,357 A | 5/1991 | Worcester et al. | 75/622 |
| 5,068,097 A | 11/1991 | Eckert et al. | 423/592 |
| 5,087,297 A | 2/1992 | Pouliquen | 148/2 |
| RE34,035 E | 8/1992 | Dimigen et al. | 428/244 |
| 5,143,590 A | 9/1992 | Strothers et al. | 204/298 |
| 5,196,916 A | 3/1993 | Ishigami et al. | 257/769 |
| 5,204,057 A | 4/1993 | Ishigami et al. | 420/417 |
| 5,209,910 A | 5/1993 | Bludssus et al. | |
| 5,234,487 A | 8/1993 | Wickersham et al. | 75/248 |
| 5,234,491 A | 8/1993 | Chang | 75/622 |
| 5,269,403 A | 12/1993 | Pouliquen et al. | 204/298 |
| 5,342,571 A | 8/1994 | Dittmar et al. | 419/13 |
| 5,406,850 A | 4/1995 | Bouchard et al. | 73/620 |
| 5,442,978 A | 8/1995 | Hildreth et al. | 75/363 |
| 5,449,445 A | 9/1995 | Shinneman et al. | 204/298 |
| 5,455,197 A | 10/1995 | Ghanbari et al. | 437/192 |
| 5,464,711 A | 11/1995 | Mogab et al. | 430/5 |
| 5,470,527 A | 11/1995 | Yamanobe et al. | 419/53 |
| 5,474,667 A | 12/1995 | Hurwitt et al. | 204/192 |
| 5,490,914 A | 2/1996 | Hurwitt et al. | 204/298 |
| 5,522,535 A | 6/1996 | Ivanov et al. | 228/122 |
| 5,529,673 A | 6/1996 | Strauss et al. | 204/298 |
| 5,530,467 A | 6/1996 | Ishigami et al. | 347/204 |
| 5,541,007 A | 7/1996 | Ueda et al. | 428/650 |
| 5,573,572 A | 11/1996 | Eckert et al. | 75/10.61 |
| 5,584,906 A | 12/1996 | Ishigami et al. | 75/336 |
| 5,590,385 A | 12/1996 | Paik | 419/10 |
| 5,590,389 A | 12/1996 | Dunlop et al. | 419/67 |
| 5,595,337 A | 1/1997 | Demaray et al. | 228/193 |
| 5,630,918 A | 5/1997 | Takahara et al. | 204/298 |
| 5,632,869 A | 5/1997 | Hurwitt et al. | 204/192 |
| 5,635,146 A | 6/1997 | Singh et al. | 423/65 |
| 5,656,216 A | 8/1997 | Lo et al. | 264/113 |
| 5,674,367 A | 10/1997 | Hunt et al. | 204/298 |
| 5,687,600 A | 11/1997 | Emigh et al. | 72/69 |
| 5,693,203 A | 12/1997 | Ohhashi et al. | 204/298.12 |
| 5,700,419 A | 12/1997 | Masunaga et al. | 264/656 |
| 5,707,599 A | 1/1998 | Northway | 423/592 |
| 5,709,783 A | 1/1998 | Sanchez et al. | 204/192 |
| 5,722,034 A | 2/1998 | Kambara | 419/26 |
| 5,733,427 A | 3/1998 | Satou et al. | 204/298 |
| 5,736,657 A | 4/1998 | Ide et al. | 75/230 |
| 5,741,404 A | 4/1998 | Cathey | 204/192 |
| 5,753,090 A | 5/1998 | Obinata | 204/298 |
| 5,766,380 A | 6/1998 | Lo et al. | 148/577 |
| 5,772,860 A | 6/1998 | Sawada et al. | 204/298 |
| 5,809,393 A | 9/1998 | Dunlop et al. | 419/61 |
| 6,193,821 B1 | 2/2001 | Zhang | 148/668 |
| 6,238,494 B1 | 5/2001 | Segal | 148/421 |
| 6,323,055 B1 | 11/2001 | Rosenberg et al. | 438/77 |
| 6,331,233 B1 | 12/2001 | Turner | 204/298.12 |
| 6,348,113 B1 | 2/2002 | Michaluk et al. | 148/668 |
| 6,348,139 B1 | 2/2002 | Shah et al. | 204/298.13 |
| 6,462,339 B1 | 10/2002 | Michaluk et al. | |
| 6,893,513 B2 | 5/2005 | Michaluk et al. | |
| 2001/0001401 A1 | 5/2001 | Segal | 148/670 |
| 2002/0063056 A1 | 5/2002 | Shah et al. | 204/298.13 |
| 2002/0125128 A1 | 9/2002 | Turner | |
| 2002/0132388 A1 | 9/2002 | Rosenberg et al. | 438/77 |
| 2002/0153248 A1 | 10/2002 | Shah et al. | 204/298.13 |

FOREIGN PATENT DOCUMENTS

| | | |
|---|---|---|
| AU | 1162395 | 8/1995 |
| CA | 2 090 919 C | 9/2004 |
| DE | 37 06 853 A1 | 9/1987 |
| DE | 37 90 259 C2 | 2/1990 |
| DE | 40 21 207 A1 | 1/1992 |
| DE | 42 07 145 C1 | 4/1993 |
| DE | 44 04 374 C1 | 5/1995 |
| DE | 198 41 774 A1 | 9/1998 |
| DE | 19841774 A1 | 3/1999 |
| EP | 08700365 | 6/1987 |
| EP | 0 285 741 | 1/1988 |
| EP | 0 285 741 B1 | 10/1990 |
| EP | 04032566 | 10/1990 |
| EP | 0 590 904 A1 | 9/1993 |
| EP | 23479894 | 4/1994 |
| EP | 0 902 102 A1 | 3/1999 |
| EP | 0 281 141 B2 | 6/2000 |
| GB | 955832 | 4/1964 |
| JP | 55-48512 | 4/1980 |
| JP | 55-179784 | 12/1980 |
| JP | 58-77813 | 4/1983 |
| JP | 58-231036 | 12/1983 |
| JP | 59-131291 | 6/1984 |
| JP | 60-122751 | 6/1985 |
| JP | 60-247022 | 11/1985 |
| JP | 60-299441 | 12/1985 |
| JP | 61-85746 | 4/1986 |
| JP | 61-133802 | 6/1986 |
| JP | 62-227856 | 9/1987 |
| JP | 62-229730 | 9/1987 |
| JP | 62-232678 | 9/1987 |
| JP | S 62-297463 | 12/1987 |
| JP | 19880119079 | 5/1988 |
| JP | 01-289559 | 11/1989 |
| JP | 01290766 A | 11/1989 |
| JP | 01-334805 | 12/1989 |
| JP | 02-102790 | 4/1990 |
| JP | 02-123021 | 5/1990 |
| JP | 03-082773 | 4/1991 |
| JP | 03-197640 | 8/1991 |
| JP | 03197640 | 8/1991 |
| JP | 04178940 | 6/1992 |
| JP | 6-264232 | 9/1994 |
| JP | 06-264232 * | 9/1994 |
| JP | 406264232 A | 9/1994 |
| WO | WO 87/07650 | 12/1987 |
| WO | WO 99/61670 | 12/1999 |
| WO | WO 99/66100 | 12/1999 |
| WO | WO 02/16667 A2 | 2/2002 |

OTHER PUBLICATIONS

Wright, "A Review of Automated Orientation Imaging Microscopy (OIM)" *Journal of Computer-Assisted Microscopy*, vol. 5, No. 3, pp. 207-221, (1993), no month data.

Arlt, Jr. "Sulfonation and Sulfation to Thorium and Thorium Compounds" *Kirk-Othmer Encyclopedia of Chemical Technology* vol. 22, pp. 541-564, (1993), no month data.

Wright, "A comparison of different texture analysis techniques" *Textures of Materials: Proceedings of the Eleventh International Conference on Textures of Materials, International Academic Publishers*, pp. 53-62 (1996), no month data.

Adams, et al. "Orientation Imaging: The Emergence of a New Microscopy" *Metallurgical Transactions*, vol. 24A-No. 4. pp. 819-831 (1993), no month data.

Adams, et al., "Orientation Imaging Microscopy: New Possibilities for Microstructural Investigation Using Automated BKD Analysis" *Materials Science Forum* vol. 157-162 (1994) pp. 31-42, no month data.

Matthies et al., "On the Geometric Mean of Physical Tensors using Orientation Distributions" *Materials Science Forum* vol. 157-162 (1994) pp. 1647-1652, no month data.

Matthies, et al. "On some Methodical Developments Concerning Calculations Performed Directly in the Orientation Space" *Materials Science Forum* vol. 157-162 (1994) pp. 1641-1646, no month data.

International Search Report mailed Apr. 12, 2000.

Kock, et al. "Tantalum-Processing, Properties and Applications" JOM vol. 41., No. 10, pp. 33-39. (1989).

Miller, "Tantalum and Niobium", Butterworths Scientific Publication, Academic Press Inc., New York, 1959, pp. 71-73 and 295-317, no month data.

Kirkbride et al., "The Effect of Yttrium on the Recrystallization and Grain Growth of Tantalum", J. Less-Common Metals, vol. 9, pp. 393-408. (1965), no month data.

National Research Corporation Press Release, pp. 1-4. (1964), no month data.

National Research Corporation Data Sheet "SGS Tantalum", pp. 1-7 (1964), no month data.

ASTM Standard Specification for Tantalum and Tantalum Alloy Plate, Sheet, and Strip, pp. 558-561 (1992), no month data.

Kumar, et al. "Effect of Intermetallic Compounds of the Properties of Tantalum" Materials Research Society Symposium Proceedings, vol. 322, pp. 413-422. (1994), no month data.

Kumar, et al. "Effect of Intermetallic Compounds of the Properties of Tantalum", Refractory Metals & Hard Materials, vol. 12, pp. 35-40 (1994), no month data.

Kirkbride et al., "The Effect of Yttrium on the Recrystallization and Grain Growth of Tantalum", J. Less-Common Metals, vol. 9, pp. 393-408. (1965), no month data.

Klein et al., "Inhomogeneous Textures in Tantalum Sheets", Materials Science Forum, vol. 157-162, pp. 1423, (1994), no month data.

Clark et al., "Influence of Transverse Rolling on the Microstructural and Texture Development in Pure Tantalum", Metallurgical Transactions, vol. 23A pp. 2183-2191. (1992), no month data.

Raabe, et al., "Texture and microstructure of rolled and annealed tantalum", Materials Science and Technology, vol. 10, pp. 299-305 (1994), no month data.

Wright et al., "Texture Gradient Effects in Tantalum", International Conference on Textures of Materials, Sep. 20-24, 1993, no month data.

Wright, et al., "Textural and Microstructural Gradient Effects on the Mechanical Behavior of a Tantalum Plate" Metall. Trans. A, 25A (1994), pp. 1025, no month data.

Clark et al., "Effect of Processing Variables on Texture and Texture Gradients in Tantalum", Metallurgical Transactions, vol. 22A, pp. 2039-2047, (Sep. 1991).

Clark et al., "Influence of Initial Ingot Breakdown on the Microstructural and Textural Development of High-Purity Tantalum", Metallurgical Transactions, vol. 22A, pp. 2959-2968, (Dec. 1991).

"Standard Test Methods for Determining Average Grain Size" pp. 1-26, no date.

Claims from Application from a 3rd Party submitted under MPEP 724.02.

Claim from Application from a 3rd Party submitted under MPEP 724.02.

Kirkbride et al., *Journal of the Less-Common Metals*, The Effect of Yttrium on the Recrystallization and Grain Growth of Tantalum, pp. 393-408, (1965), no month.

American Society for Metals, Ohio, *Metals Handbook Desk Edition*, Glossary of Metallurgical Terms and Engineering Tables; Table A.; and Preparation and Characterization of Pure Metals, (1985), no month.

John Wiley & Sons, Inc., *Structure and Properties of Materials*, pp. v. 167, (1967), no month.

ASTM, *Standard Guide for Analysis and Reporting the Impurity Content and Grade of High Purity Metallic Sputtering Targets for Electronic Thin Film Application*[1], pp. 1-2, no date.

John Wiley & Sons, Inc., *Hawley's Condensed Chemical Dictionary*, 14th Ed., p. 36, (2001), no month.

McGraw-Hill, Inc., *McGraw -Hill Concise Encyclopedia of Science & Technology*, 2nd Ed., pp. 67-68, (1989), no month.

Bleck et al., *Dir. Prop. Mat'ls*, 1 page Chart, (1988), no month.

National Research Corporation, Cambridge Mass., *New Form of Tantalum Produced By Nat'l Research Corporation*, 11 pages, (Jul. 2, 1964).

ASTM, *Standard Specification for Tantalum Alloy Plate, Sheet, and Strip*[1], pp. 558. 4559-561, (1992), no month.

ASTM, *Tentative Specification for Tantalum Ingots and Flat Mill Products*[1], pp. 595-600, (1962), no month.

Tosoh Purchase Order dated Feb. 1, 1996.

Tosoh Purchase Order dated Sep. 6, 1996.

Tosoh Purchase Order dated Dec. 17, 1993.

Quotation to The ALTA Group dated Oct. 13, 1997 and Oct. 16, 1997.

Hughes et al., "Grain Subdivision and the Development of Local Orientations in Rolled Tantalum," *The Minerals, Metals & Materials Society*, p. 257-262, (1996).

Kumar et al., "Corrosion Resistant Properties of Tantalum," *NACE International*, Paper No. 253, p. 253/1-253/14 (1995).

Friedman, "Grain Size Refinement in Tantalum Ingot," *Metallurgical Transactions*, vol. 2, p. 337-341, Jan. 1971.

Titterington et al., "The Production and Fabrication of Tantalum Powder," *Symposium on Powder Metallurgy 1954*, Special Report No. 58, p. 11-18.

Michaluk, "Factors Affecting the Mechanical Properties and Texture of Tantalum," *The Minerals, Metals & Materials Society*, p. 205-217, (1996).

Tripp, "The Production of Tantalum by the Sodium Reduction Process," *The Minerals, Metals & Materials Society*, p. 23-27, (1996).

Fukang et al., "Tantalum Industry in China," *The Minerals, Metals & Materials Society*, p. 287-292, (1996).

Suri et al., "Studies on Tantalum Extraction," *The Minerals, Metals & Materials Society*, p. 39-46, (1996).

Nair et al., "Production of Tantalum Metal by the Aluminothermic Reduction of Tantalum Pentoxide," *Journal of the Less-Common Metals*, vol. 41, p. 87-95, (1975).

Klopp, et al., "Purification Reactions of Tantalum During Vacuum Sintering," *Transactions of The Metallurgical Society of AIME*, vol. 218, p. 971-977, Dec. 1960.

Jain et al., "Pilot Plant Production of Capacitor Grade Tantalum Powder," *Transactions of The Indian Institute of Metals*, p. 1-8, Dec. 1971.

Crockett et al., "Niobium (Columbium) and Tantalum," *International Strategic Minerals Inventory Summary Report, U.S. Geological Survey Circular* 930-M, p. 1-36, (1993).

Kononov et al., "Electrorefining in Molten Salts—An Effective Method of High Purity Tantalum, Hafnium and Scandium Metal Production," *Journal of Alloys and Compounds* 218, p. 173-176, (1995).

Bose et al., "Preparation of Capacitor Grade Tantalum Powder," *Transactions of the Indian Institute of Metals*, p. 1-5, Jun. 1970.

Gupta, "Extractive Metallurgy of Niobium, Tantalum, and Vanadium," *International Metals Reviews*, vol. 29, No. 6, p. 405-444, (1984).

Hojas, "Radial Forging," Metals Handbook, 9th Edition, vol. 14, p. 145-149. (1988).

"Tantalum and Tantalum Compounds," *Encyclopedia of Chemical Technology*, vol. 22, Third Edition, p. 541-564.

"Miller Indices," *Manual of Mineralogy*, 20th Edition, p. 39-40.

Wright et al., Effect of Annealing Temperature on the Texture of Rolled Tantalum and Tantalum-10 Wt.% Tungsten, *Tungsten and Refractory Metals 2*, p. 501-508.

Eckert, "The Industrial Application of Pyrometallurgical Chlorination and Hydrometallurgy for Producting Tantalum Compounds," *The Minerals, Metals & Materials Society*, p. 55-61.

Albrecht et al., "Modern Extraction of Tantalum and Niobium With Special Emphasis on the Production of High Purity Compounds," p. 219-240.

Korinek, "Tantalum—An Overview," *The Minerals, Metals & Materials Society*, p. 3-15.

Burns et al., "Evolution of Applications of Tantalum," *The Minerals, Metals & Materials Society*, p. 273-285.

Jun et al., "Low Temperature Deposition of TaCN Films Using Pentakis (Diethylamido) Tantalum," *Mat. Res. Soc. Symp. Proc.* vol. 217, *Materials Research Society*, p. 349-354, (1996).

Notice of Opposition filed in EP 99962850.6 filed by Honeywell International, Inc., dated Jul. 26, 2005.

Notice of Opposition filed in EP 99962850.6 filed by Plansee AG, dated Jul. 26, 2005 (with translation).

Notice of Opposition filed in EP 99962850.6 filed by H.C. Starck GmbH, dated Jul. 26, 2005 (with translation).

Notice of Opposition filed in EP 99962850.6 filed by Praxair, Inc., dated Jul. 26, 2005.

Pokross, "Controlling the Texture of Tantalum Plate," JOM, Oct. 1989, pp. 46-49.

Savitskii et al., "Physical Metallurgy of Refractory Metals and Alloys—Chapter II—Interatomic Bond and Crystal Structure," Academy of Sciences of the USSR, 1970, pp. 47-51.

Savitskii et al., "Physical Metallurgy of Refractory Metals and Alloys—Chapter V—Single Crystals," Academy of Sciences of the USSR, 1970, pp. 176-179.

Römpp, Chemie Lexicon, $10^{th}$ Edition, 1999, pp. 4392-4393.

Wright et al., "Textural and Microstructural Gradient Effects on the Mechanical Behavior of a Tantalum Plate," Metallurgical and Materials Transactions A, vol. 25A, May 1994, pp. 1025-1031.

Feng et al., ". . . Texture in Cold-Rolled Ta Ingot," JOM, Oct. 1989, pp. 40-45.

Hashimoto et al., "High Quality $Ta_2O_5$ Films Using Ultra-High Purity Ta Sputtering Target," Extended Abstracts of the $18^{th}$ (1986 International) Conference on Solid State Devices and Materials, 1986, pp. 253-256.

Mundekis, "Effects of Rolling Schedule and Annealing on the High Strain Rate Behavior of Tantalum," presented at TMS meeting in Cincinnati, Ohio, 1991, pp. 1-24.

Cardonne et al., "Tantalum and its Alloys," Advanced Materials and Processes, Sep. 1992, pp. 16-20.

Cardonne et al., "Tantalum and its Alloys," Int. J. of Refractory Metals & Hard Materials, vol. 13, 1995, pp. 187-194.

Jean D'Ans et al., "Mecnahisch-thermische Konstanten for das Gleichgewicht heterogener Systeme," Taschenbuch For Chemiker Und Physiker, 1949, p. 864.

Opposition to European Patent 1 137 820, Exhibit A, 7 pages, "4" Pure Tantalum Target from H.C. Starck.

Opposition to European Patent 1 137 820, Exhibit B, 2 pages, Jul. 31, 1998.

Anderson, "Atom Ejection in Low Energy Sputtering of Single Crystals of bbc Metals", Journal of Applied Physics, vol. 34, No. 3, Mar. 1963, pp. 659-663.

Erginsoy et al., "Dynamics of Radiation Damage in a Body-Centered Cubic Lattice", Physical Review, vol. 133, No. 2A, Jan. 20, 1964, pp. A595-A606.

Lassila et al., "Mechanical Behavior of Tantalum and Tantalum-Tungsten Alloys: Texture Gradients and Macro/Micro-Response," $14^{th}$ U.S. Army Symposium on Solid Mechanics, Nov. 30, 1996 (14 pgs.).

Michaluk, "Deformation Behavior of Tantalum-Tangsten Alloys," a Thesis submitted to the Faculty of Drexel University, Dec. 1993 (158 pgs.).

Michaluk et al., "The Effect of Oxygen, Grain Size, and Strain Rate on the Mechanical Behavior of Forged P/M Tantalum," (pp. 195-204), P/M Aerosp. Def. Demanding Appl. (1993).

Hoge, "Influence of Strain Rate on Flow Stress of Tantalum," Lawrence Radiation Laboratory, University of California, Paper 15A.4, (pp. 996-1000) Int. Conf. Strength Metals Alloys, Conf. Proc. $2^{nd}$ (1970), vol. 3.

Rudolph et al., "The Deformation of Tantalum-Niobium and Tantalum-Molybdenum Single Crystals," Z. Metallkde., No. 58, H. 10, 1967 (pp. 708-713).

Regazzoni et al., "Influence of Strain Rate on the Flow Stress and Ductility of Copper and Tantalum at Room Temperature," Inst. Phys. Conf. Ser. No. 70, paper presented at $3^{rd}$ Conf. Mech. Prop. High Rates of Strain, Oxford, 1984 (pp. 63-70).

Diaz et al., "Evidence for Slow Strain-Rate Embrittlement in Tantalum Due to Oxygen," Scripta Metallurgica, vol. 13, 1979 (pp. 491-496.

Mundekis et al., "Effects of Rolling Schedule and Annealing on the High Strain Rate Behavior of Tantalum," The Minerals, Metals & Materials Society, 1992 (pp. 77-96).

Landrum et al., "The Effects of Cold-Flowing on Tantalum Material Properties," The Minerals, Metals & Materials Society, 1992 (pp. 59-76).

Gourdin et al., "The Influence of Tungsten Alloying on the Mechanical Properties of Tantalum," Journal De Physique IV, Colloque C8, vol. 4, Sep. 1994 (pp. C8-207-C8-212).

Lassila et al., "Effects of Shock Prestrain on the Dynamic Mechanical Behavior of Tantalum," Journal De Physique IV, Colloque C3, vol. 1, Oct. 1991 (pp. C3-19-C3-26).

Ulitchny et al., "The Effects of Interstitial Solute Additions on the Mechanical Properties of Niobium and Tantalum Single Crystals," Journal of the Less-Common Metals, vol. 33, 1973 (pp. 105-116).

Hull et al., "Introduction to Dislocations," $3^{rd}$ Edition, 1984 (cover page & contents pp. v-vii only).

"Mechanical Fundamentals," Dieter Mech. Metallurgy, $3^{rd}$ Ed., 1986 (pp. 82-86).

Gray et al., "The High-Strain-Rate and Spallation Response of Tantalum, Ta-10W, and T-111," The Minerals, Metals & Materials Society, 1992 (pp. 303-315).

Rajendran et al., "Effects of Strain Rate on Plastic Flow and Fracture in Pure Tantalum," J. Mater. Shaping Technol., vol. 9, 1991 (pp. 7-20).

Cardonne et al., "Tantalum and Its Alloys," Advanced Materials & Processes, vol. 142, No. 3, Sep. 1992 (pp. 16-20).

Pokross, "Tantalum," Metals Handbook, $10^{th}$ Ed., vol. 2, Properties and Selection: Nonferrous Alloys and Special-Purpose Materials, 1990 (pp. 571-574).

Raman et al., "Rapid Consolidation of Tantalum: Non Conventional Microstructure and Resultant Dynamic Mechanical Properties," (pp. 559-571) (1994).

Barbee et al., "Dislocation Structures in Deformed and Recovered Tantalum," Journal of the Less-Common Metals, vol. 8, 1965 (pp. 306-319).

Fujii et al., "On the Rolling Deformation and Recrystallization of (111) [112] Singel Crystals of High-Purity Tungsten, Molybdenum and Tantalum," Journal of the Less-Common Metals, vol. 39, 1975 (pp. 161-172).

Welch et al., "Consideration of Anisotropy Parameters in Polycrystalline Metals," Z. Metallkde, Bd. 74, H. 4, 1983 (pp. 233-237).

Arsenault, "Effects of Strain Rate and Temperature on Yield Points," Transactions of the Metallurgical Society of AIME, vol. 230, Dec. 1964 (pp. 1570-1576).

Gray et al., "Influence of Peak Pressure and Temperature on the Structure/Property Response of Shock Loaded Ta and Ta-10W," Metallurgical and Materials Transactions A, vol. 26A, Oct. 1995 (pp. 2555-2563).

Giannotta et al., "Ductility and Flow Rule of Tantalum at 20° C. and 500° C.," Journal De Physique, Colloque C5, No. 8, Tome 46, Aug. 1985 (pp. C5-49-54).

Ferriss et al., "Deformation of Tantalum Single Crystals," Transactions of the Metallurgical Society of AIME, vol. 224, Oct. 1962 (pp. 975-981).

Mitchell et al., "Mechanical Properties of Some Tantalum Alloys," Canadian Journal of Physics, vol. 45, 1967 (pp. 1047-1062).

Arsenault, "An Investigation of the Mechanism of Thermally Activated Deformation in Tantalum and Tantalum-Base Alloys," Acta Metallurgica, vol. 14, Jul. 1966 (pp. 831-838).

Zerilli et al., "Description of Tantalum Deformation Behavior by Dislocation Mechanics Based Constitutive Relations," J. Appl. Phys. vol. 68, No. 4, Aug. 15, 1990 (pp. 1580-1591).

Michaluk et al., "The Effects of Texture and Strain on the R-Value of Heavy Gauge Tantalum Plate," Materials Science Forum, vol. 157-162, 1994 (pp. 1653-1662).

Spitzig et al., "Dislocation Arrangements in Tantalum Single Crystals Deformed in Tension at 373°K," ACTA Metallurgica, vol. 14, Oct. 1966 (pp. 1311-1323).

Hoge et al., "The Temperature and Strain Rate Dependence of the Flow Stress of Tantalum," Journal of Materials Science, vol. 12, 1977 (pp. 1666-1672).

Fyfe et al., "Dynamic Pre-Strain and Inertia Effects on the Fracture of Metals," J. Mich. Phys. Solids, vol. 28, 1980 (pp. 17-26).

Pappu et al, "High-Strain-Rate Behavior of Pure Tantalum in Explosively Formed Penetrator and Shaped Charge Regimens," Metallurgical and Materials Applications of Shock-Wave and High-Strain-Rate Phenomena, 1995 (pp. 495-502).

Wright et al., "Texture Gradient Effects in Tantalum," Materials Science Forum, vol. 157-162, 1994 (pp. 1695-1700).

Mitchell et al., "Three-Stage Hardening in Tantalum Single Crystals," ACTA Metallurgica, vol. 13, Nov. 1965 (pp. 1169-1179).

Suzuki, "Development of Refractory Metals and Silicides Targets, and Their Characteristics," Materials Research Society, 1987 (pp. 339-345).

Ohba et al., "Effect of Zone-Refining on Orientations of Recrystallized Grains Formed in Rolled and Annealed Pure Mo and Ta Single Crystals," Journal of the Less-Common Metals, vol. 52, 1977 (pp. 93-99).

Fujii et al., "On the Deformation and Recrystallization of (001)[110] Single Crystals to Pure Tungsten Rolled at 200° C. and Tantalum at 100° C.," Trans. JIM, vol. 16, 1975 (pp. 219-224).

Kaneko et al., "Mechanical Properties of Ta Single Crystals Grown by Electron Beam Melting Methods," (Abstract in English), Nihon Daigaku Kagakubu Kiyo, A, Kogaku Hen (1975), 16.

Kaneko, "The Effect of Crystallographic Orientation on Mechanical Properties of Ta Single Crystals Grown by Electron Beam Melting Methods," (pp. 22-30) (Abstract in English), Funtai Ogobi Funmatsu Yakin (1990), 37(3).

Singh, "Ultrapurification of Refractory Metals," High Temperature Materials and Processes, vol. 11, Issue 1-4, Jan. 1993 (pp. 305-349).

Izumi, "Processing of Ta Powder and Mill Products at Showa-Cabot Supermetal Higashi-Nagahara Plant," Shigen-to-Sozai, vol. 109, 1993 (pp. 1181-1186).

Okamoto et al., "Determination of Th, U, Na and K in High-Purity Tantalum," Journal of the Iron and Steel Institute of Japan, 1991 (pp. 1929-1935) (Synopsis in English).

Park et al., "Determination of Impurities in Tantalum by a Radiochemical Neutron Activation Analysis," Journal of Radioanalytical and Nuclear Chemistry, Articles, vol. 168, No. 2, 1993 (pp. 497-502).

Krivan et al., "Analysis of Tantalum by IICP-AES Involving Trace-Matrix Separation," Fresenius J. Anal. Chem., vol. 341, 1991 (pp. 550-554).

Takahashi et al., "Determination of Impurities in High Purity Tantalum by Inductively Coupled Plasma Atomic Emission Spectrometry with Ion Exchange Method," Kawasaki Steel GIHO, vol. 21, No. 2, 1989 (pp. 119-123).

Izumi, "Improvement in Characteristics of High Purity Tantalum by Doping and Embrittlement Mechanism of Tantalum Wire Used in Tantalum Capacitors," (pp. 59-84) (in Japanese with English translation, pp. 24-51), Denkai Chikudenki Hyoron (1997), 48(1).

Materials for Evaporation & Sputtering, Materials Research Corporation, Third Edition, Nov. 1980 (pp. 1-24).

Gruber et al., "Eletron Beam Melting with Multiple Guns," Transactions of the Eighth National Vacuum Symposium, Combined With the Second Int'l. Congress on Vacuum Science and Technology, vol. 2, Oct. 16-19, 1961 (pp. 722-731).

Choi et al., "Textures of Tantalum Metal Sheets by Neutron Diffraction," Journal of Materials Science, vol. 28, 1993 (pp. 3283-3290).

Sibley et al., "Experience with an Electron Beam Melting Furnace," Trans. Natl. Vacuum Symp. (1962), vol. 1961, 8, pp. 714-721.

Interlocutory decision in Opposition Proceedings (Art. 101(3)(a) and 106(2) EPC) and related documents issued by the European Patent Office, dated Apr. 29, 2008, for European Patent No. 1137820 (European Patent Application No. 99962850.5-2122) (52 pages).

Provision of the minutes in accordance with Rule 124(4) EPC and related documents issued by the European Patent Office, dated Apr. 29, 2008, for European Patent No. 1137820 (European Patent Application No. 99962850.5-2122) (45 pages).

* cited by examiner 0.500" PLATE 142
Slab Anneal: 1050    Plate Anneal 1000
Grain Size: 6.5
Increment: 0.025"

| Increment | (111) | (100) | ln(ratio) |
|---|---|---|---|
| 1 | 3.502 | 3.495 | 0.00 |
| 2 | 0.848 | 2.988 | -1.26 |
| 3 | 0.412 | 3.998 | -2.27 |
| 4 | 0.304 | 0.676 | -0.80 |
| 5 | 0.52 | 0.717 | -0.32 |
| 6 | 1.167 | 1.401 | -0.18 |
| 7 | 1.493 | 1.691 | -0.12 |
| 8 | 2.071 | 1.445 | 0.36 |
| 9 | 2.039 | 1.77 | 0.14 |
| 10 | 2.19 | 1.643 | 0.29 |
| 11 | 1.541 | 0.327 | 1.55 |
| 12 | 6.722 | 0.091 | 4.30 |
| 13 | 4.228 | 0.131 | 3.47 |
| 14 | 1.904 | 1.455 | 0.27 |
| 15 | 1.514 | 2.136 | -0.34 |
| 16 | 1.366 | 1.26 | 0.08 |
| 17 | 1.388 | 0.904 | 0.43 |
| 18 | 0.709 | 1.504 | -0.75 |
| 19 | 0.615 | 0.395 | 0.44 |
| 20 | 1.027 | 0.499 | 0.72 |

0.500" PLATE 140
Slab Anneal: 1150  Plate Anneal: 1000
Grain Size: 6.5
Increment: 0.025"

| Increment | (111) | (100) | ln(ratio) |
|---|---|---|---|
| 1 | 1.786 | 1.286 | 0.33 |
| 2 | 1.745 | 0.433 | 1.39 |
| 3 | 1.948 | 0.782 | 0.91 |
| 4 | 3.232 | 2.3 | 0.34 |
| 5 | 2.892 | 3.517 | -0.20 |
| 6 | 1.061 | 3.701 | -1.25 |
| 7 | 3.501 | 0.522 | 1.90 |
| 8 | 1.026 | 1.944 | -0.64 |
| 9 | 4.783 | 0.608 | 2.06 |
| 10 | 2.402 | 0.535 | 1.50 |
| 11 | 3.097 | 2.547 | 0.20 |
| 12 | 0.859 | 2.571 | -1.10 |
| 13 | 2.585 | 0.897 | 1.06 |
| 14 | 0.872 | 2.955 | -1.22 |
| 15 | 1.439 | 1.28 | 0.12 |
| 16 | 1.657 | 2.131 | -0.25 |
| 17 | 1.395 | 1.765 | -0.24 |
| 18 | 2.506 | 1.105 | 0.82 |
| 19 | 1.541 | 1.381 | 0.11 |
| 20 | 0.593 | 1.696 | -1.05 |

0.500" PLATE 141
Slab Anneal: 1300   Plate Anneal: 1000
Grain Size: 6.5
Increment: 0.025"

| Increment | (111) | (100) | ln(ratio) |
|---|---|---|---|
| 1 | 1.577 | 3.039 | -0.66 |
| 2 | 1.125 | 1.032 | 0.09 |
| 3 | 1.007 | 1.824 | -0.59 |
| 4 | 2.001 | 0.698 | 1.05 |
| 5 | 2.091 | 2.748 | -0.27 |
| 6 | 4.892 | 1.906 | 0.94 |
| 7 | 0.886 | 4.336 | -1.59 |
| 8 | 6.052 | 0.882 | 1.93 |
| 9 | 3.392 | 0.317 | 2.37 |
| 10 | 2.177 | 1.376 | 0.46 |
| 11 | 3.431 | 2.973 | 0.14 |
| 12 | 3.628 | 1.589 | 0.83 |
| 13 | 3.458 | 0.637 | 1.69 |
| 14 | 2.095 | 1.368 | 0.43 |
| 15 | 1.869 | 1.023 | 0.60 |
| 16 | 1.371 | 2.226 | -0.48 |
| 17 | 2.032 | 1.143 | 0.58 |
| 18 | 1.949 | 1.754 | 0.11 |
| 19 | 2.175 | 3.521 | -0.48 |
| 20 | 5.092 | 2.802 | 0.60 |

0.250" PLATE 125B
Slab Anneal: 1150   Plate Anneal: 1000
Grain Size: 6.5
Increment: 0.0125"

| Increment | (111) | (100) | ln(ratio) |
|---|---|---|---|
| 1 | 4.159 | 2.577 | 0.48 |
| 2 | 6.06 | 0.27 | 3.11 |
| 3 | 4.407 | 0.964 | 1.52 |
| 4 | 2.336 | 1.175 | 0.69 |
| 5 | 2.023 | 2.155 | -0.06 |
| 6 | 3.733 | 2.091 | 0.58 |
| 7 | 4.117 | 2.131 | 0.66 |
| 8 | 4.718 | 2.721 | 0.55 |
| 9 | 5.367 | 2.604 | 0.72 |
| 10 | 2.876 | 5.519 | -0.65 |
| 11 | 4.952 | 2.886 | 0.54 |
| 12 | 4.12 | 3.362 | 0.20 |
| 13 | 2.752 | 1.715 | 0.47 |
| 14 | 0.949 | 4.93 | -1.65 |
| 15 | 1.108 | 4.827 | -1.47 |
| 16 | 1 | 3.157 | -1.15 |
| 17 | 2.357 | 6.294 | -0.98 |
| 18 | 0.846 | 10.654 | -2.53 |
| 19 | 1.628 | 5.369 | -1.19 |
| 20 | 0.866 | 4.458 | -1.64 |

0.250" PLATE 125C
Slab Anneal: 1300   Plate Anneal: 1000
Grain Size: 6.5
Increment: 0.0125"

| Increment | (111) | (100) | ln(ratio) |
|---|---|---|---|
| 1 | 2.154 | 1.516 | 0.35 |
| 2 | 1.174 | 1.282 | -0.09 |
| 3 | 0.79 | 5.846 | -2.00 |
| 4 | 0.981 | 2.736 | -1.03 |
| 5 | 1.938 | 3.55 | -0.61 |
| 6 | 2.302 | 3.179 | -0.32 |
| 7 | 5.221 | 1.661 | 1.15 |
| 8 | 3.636 | 2.6 | 0.34 |
| 9 | 2.982 | 1.083 | 1.01 |
| 10 | 6.161 | 0.322 | 2.95 |
| 11 | 7.636 | 0.623 | 2.51 |
| 12 | 7.336 | 0.46 | 2.77 |
| 13 | 4.415 | 6.945 | -0.45 |
| 14 | 2.37 | 1.953 | 0.19 |
| 15 | 2.516 | 3.636 | -0.37 |
| 16 | 1.99 | 1.976 | 0.01 |
| 17 | 2.696 | 0.769 | 1.25 |
| 18 | 3.155 | 5.257 | -0.51 |
| 19 | 4.558 | 0.879 | 1.65 |
| 20 | 1.788 | 0.595 | 1.10 |

0.400" FORGING 950A
Billet Anneal: 1050    PreformAnneal: 1050
FinishAnneal: 950    Grain Size: 7.1
Increment: 0.020"

| Increment | (111) | (100) | ln(ratio) |
|---|---|---|---|
| 1 | 2.127 | 6.911 | -1.18 |
| 2 | 4.289 | 4.447 | -0.04 |
| 3 | 3.421 | 4.819 | -0.34 |
| 4 | 3.065 | 4.67 | -0.42 |
| 5 | 3.879 | 4.672 | -0.19 |
| 6 | 2.33 | 5.309 | -0.82 |
| 7 | 8.206 | 1.239 | 1.89 |
| 8 | 9.086 | 0.57 | 2.77 |
| 9 | 9.615 | 0.425 | 3.12 |
| 10 | 10.558 | 1.57 | 1.91 |
| 11 | 12.83 | 0.883 | 2.68 |
| 12 | 9.168 | 2.094 | 1.48 |
| 13 | 8.395 | 2.002 | 1.43 |
| 14 | 11.219 | 3.961 | 1.04 |
| 15 | 2.512 | 3.816 | -0.42 |
| 16 | 5.044 | 4.613 | 0.09 |
| 17 | 3.898 | 6.144 | -0.46 |
| 18 | 2.297 | 6.159 | -0.99 |
| 19 | 5.796 | 6.809 | -0.16 |
| 20 | 2.799 | 6.72 | -0.88 |

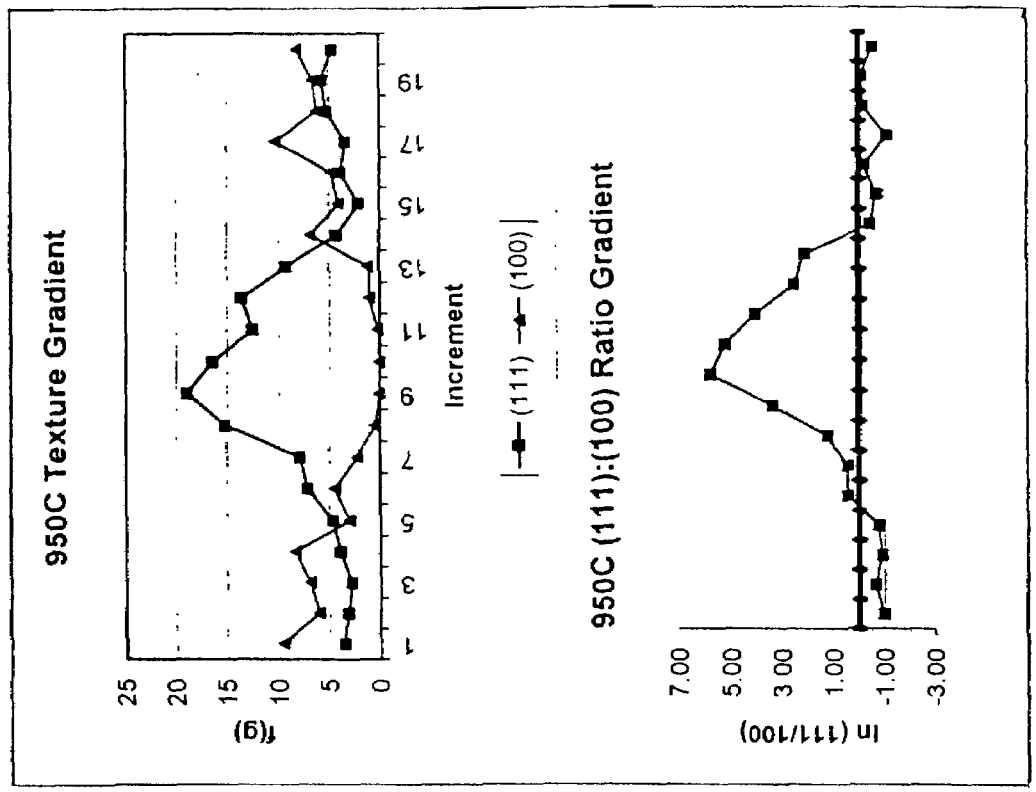
Fig. 10A
Fig. 10B
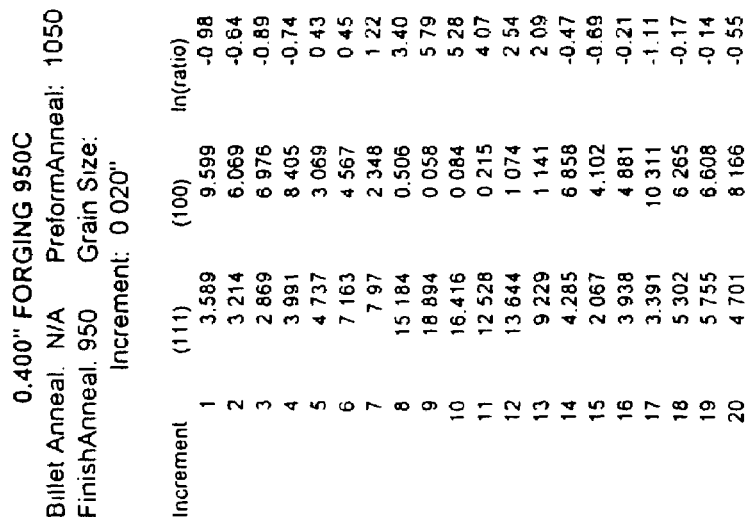
0.400" FORGING 950C
Billet Anneal: N/A   PreformAnneal: 1050
FinishAnneal: 950   Grain Size:
Increment: 0.020"
| Increment | (111) | (100) | ln(ratio) |
|---|---|---|---|
| 1 | 3,589 | 9,599 | -0.98 |
| 2 | 3,214 | 6,069 | -0.64 |
| 3 | 2,869 | 6,976 | -0.89 |
| 4 | 3,991 | 8,405 | -0.74 |
| 5 | 4,737 | 3,069 | 0.43 |
| 6 | 7,163 | 4,567 | 0.45 |
| 7 | 7,97 | 2,348 | 1.22 |
| 8 | 15,184 | 0,506 | 3.40 |
| 9 | 18,894 | 0,058 | 5.79 |
| 10 | 16,416 | 0,084 | 5.28 |
| 11 | 12,528 | 0,215 | 4.07 |
| 12 | 13,644 | 1,074 | 2.54 |
| 13 | 9,229 | 1,141 | 2.09 |
| 14 | 4,285 | 6,858 | -0.47 |
| 15 | 2,067 | 4,102 | -0.69 |
| 16 | 3,938 | 4,881 | -0.21 |
| 17 | 3,391 | 10,311 | -1.11 |
| 18 | 5,302 | 6,265 | -0.17 |
| 19 | 5,755 | 6,608 | -0.14 |
| 20 | 4,701 | 8,166 | -0.55 |

0.400" FORGING 950D
Billet Anneal: N/A   PreformAnneal: N/A
FinishAnneal: 950   Grain Size:
Increment: 0.020"

| Increment | (111) | (100) | In(ratio) |
|---|---|---|---|
| 1 | 1.836 | 9.65 | -1.66 |
| 2 | 4.837 | 7.584 | -0.45 |
| 3 | 5.785 | 5.354 | 0.08 |
| 4 | 1.468 | 10.297 | -1.95 |
| 5 | 0.781 | 17.101 | -3.09 |
| 6 | 8.097 | 9.559 | -0.17 |
| 7 | 18.984 | 1.486 | 2.55 |
| 8 | 25.471 | 0.166 | 5.03 |
| 9 | 31.554 | 0.053 | 6.39 |
| 10 | 29.911 | 0.075 | 5.99 |
| 11 | 25.476 | 0.055 | 6.14 |
| 12 | 21.407 | 1.494 | 2.66 |
| 13 | 6.505 | 2.777 | 0.85 |
| 14 | 0.065 | 1.665 | -3.24 |
| 15 | 0.052 | 4.2 | -4.39 |
| 16 | 0.528 | 9.288 | -2.87 |
| 17 | 1.122 | 8.954 | -2.08 |
| 18 | 2.67 | 8.715 | -1.18 |
| 19 | 5.137 | 8.222 | -0.47 |
| 20 | 1.453 | 10.944 | -2.02 |

HIGH PURITY TANTALUM, PRODUCTS CONTAINING THE SAME, AND METHODS OF MAKING THE SAME

The application is a continuation of prior U.S. patent application Ser. No. 09/922,815 filed Aug. 6, 2001, which is a continuation of prior U.S. patent application Ser. No. 09/199,569 filed Nov. 25, 1998, now U.S. Pat. No. 6,348,113.

BACKGROUND OF THE INVENTION

The present invention relates to metals, in particular tantalum, and products made from tantalum as well as methods of making and processing the tantalum.

In industry, there has always been a desire to form higher purity metals for a variety of reasons. With respect to tantalum, higher purity metals are especially desirable due to tantalum's use as a sputtering target and its use in electrical components such as capacitors. Thus, impurities in the metal can have an undesirable effect on the properties of the articles formed from the tantalum.

When tantalum is processed, the tantalum is obtained from ore and subsequently crushed and the tantalum separated from the crushed ore through the use of an acid solution and density separation of the acid solution containing the tantalum from the acid solution containing niobium and other impurities. The acid solution containing the tantalum is then crystallized into a salt and this tantalum containing salt is then reacted with pure sodium in a vessel having an agitator typically constructed of nickel alloy material, wherein tungsten or molybdenum is part of the nickel alloy. The vessel will typically be a double walled vessel with pure nickel in the interior surface. The salt is then dissolved in water to obtain tantalum powder. However, during such processing, the tantalum powder is contaminated by the various surfaces that it comes in contact with such as the tungsten and/or molybdenum containing surfaces. Many contaminants can be volatized during subsequent melting, except highly soluble refractory metals (e.g., Nb, Mo, and W). These impurities can be quite difficult or impossible to remove, thus preventing a very high purity tantalum product.

Accordingly, there is a desire to obtain higher purity tantalum products which substantially avoid the contaminations obtained during the processing discussed above. Also, there is a desire to have a tantalum product having higher purity, a fine grain size, and/or a uniform texture. Qualities such as fine grain size can be an important property for sputtering targets made from tantalum since fine grain size can lead to improved uniformity of thickness of the sputtered deposited film. Further, other products containing the tantalum having fine grain size can lead to improved homogeneity of deformation and enhancement of deep drawability and stretchability which are beneficial in making capacitors cans, laboratory crucibles, and increasing the lethality of explosively formed penetrators (EFP's). Uniform texture in tantalum containing products can increase sputtering efficiency (e.g., greater sputter rate) and can increase normal anisotropy (e.g., increased deep drawability), in preform products.

SUMMARY OF THE PRESENT INVENTION

A feature of the present invention is to provide a high purity tantalum product exhibiting a fine grain structure and/or uniform texture.

Another feature of the present invention is to provide articles, products, and/or components containing the high purity tantalum.

An additional feature of the present invention is to provide processes to make the high purity tantalum product as well as the articles, products, and/or components containing the high purity tantalum.

Additional features and advantages of the present invention will be set forth in part in the description which follows, and in part will be apparent from the description, or may be learned by practice of the present invention. The objectives and other advantages of the present invention will be realized and attained by means of the elements and combinations particularly pointed out in the description and appended claims.

To achieve these and other advantages, and in accordance with the purpose of the present invention, as embodied and broadly described herein, the present invention relates to tantalum metal having a purity of at least 99.995% and more preferably at least 99.999%. The tantalum metal preferably has a fine grain structure and/or uniform texture.

The present invention further relates to an alloy or mixture comprising tantalum, wherein the tantalum present in the alloy or mixture has a purity of at least 99.995% and more preferably at least 99.999%. The alloy or mixture (e.g., at least the tantalum present in the alloy or mixture) also preferably has a fine grain structure and/or uniform texture.

The present invention also relates to a high purity tantalum, e.g., suitable for use as a sputtering target, having a fully recrystallized grain size with an average grain size of about 150 μm or less and/or having a primary (111)-type texture substantially throughout the thickness of the tantalum and preferably throughout the entire thickness of the tantalum metal and/or having an absence of strong (100) texture bands within the thickness of the tantalum.

The present invention further relates to manufacturing plate and sheet from the above-mentioned tantalum by flat-forging the tantalum, machining into rolling slabs, annealing rolling slabs, rolling into plate or sheet, then annealing the plate or sheet. Final products such as sputtering targets can be then machined from the annealed plate or sheet.

The present invention also relates to a sputtering target comprising the above-described tantalum and/or alloy. The sputtering target can also be formed by radial forging and subsequent round processing to produce billets or slugs, which are then forged and rolled to yield discs, which can then be machined and annealed.

The present invention further relates to resistive films and capacitors comprising the above-described tantalum and/or alloy.

The present invention also relates to articles, components, or products which comprise at least in part the above-described tantalum and/or alloy.

Also, the present invention relates to a process of making the above-described tantalum which involves reacting a salt-containing tantalum with pure sodium or other suitable salt in a reactive container or pot and an agitator which both are made from or have a liner comprising a metal or alloy thereof which has the same or higher vapor pressure as tantalum at the melting point of tantalum.

The present invention further relates to processing tantalum powder by melting the tantalum powder in a high vacuum of $10^{-2}$ torr or more. The pressure above the melt is lower than the vapor pressures of the impurities existing in the tantalum. Preferably, the melting of the tantalum powder is accomplished by electron beam melting.

It is to be understood that both the foregoing general description and the following detailed description are exemplary and explanatory only and are intended to provide further explanation of the present invention, as claimed.

DETAILED DESCRIPTION OF THE PRESENT INVENTION

Figures 1A, 1B:
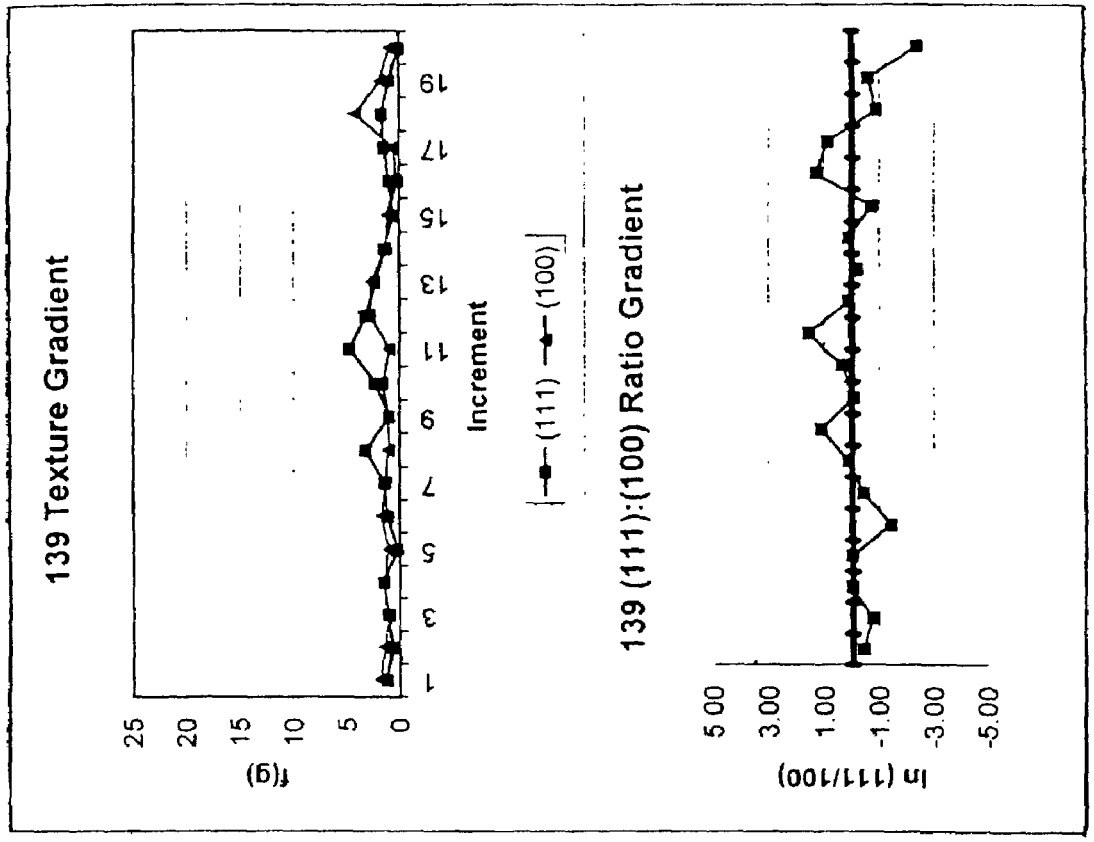
FIGS. 1(A-B)-11(A-B) are graphs and corresponding data relating to texture gradient (incremental thickness vs. random) and log ratio (111):(100) gradients (incremental thickness vs. Ln (111/100)) of high purity tantalum plates of the present invention.
Figures 2A, 2B:
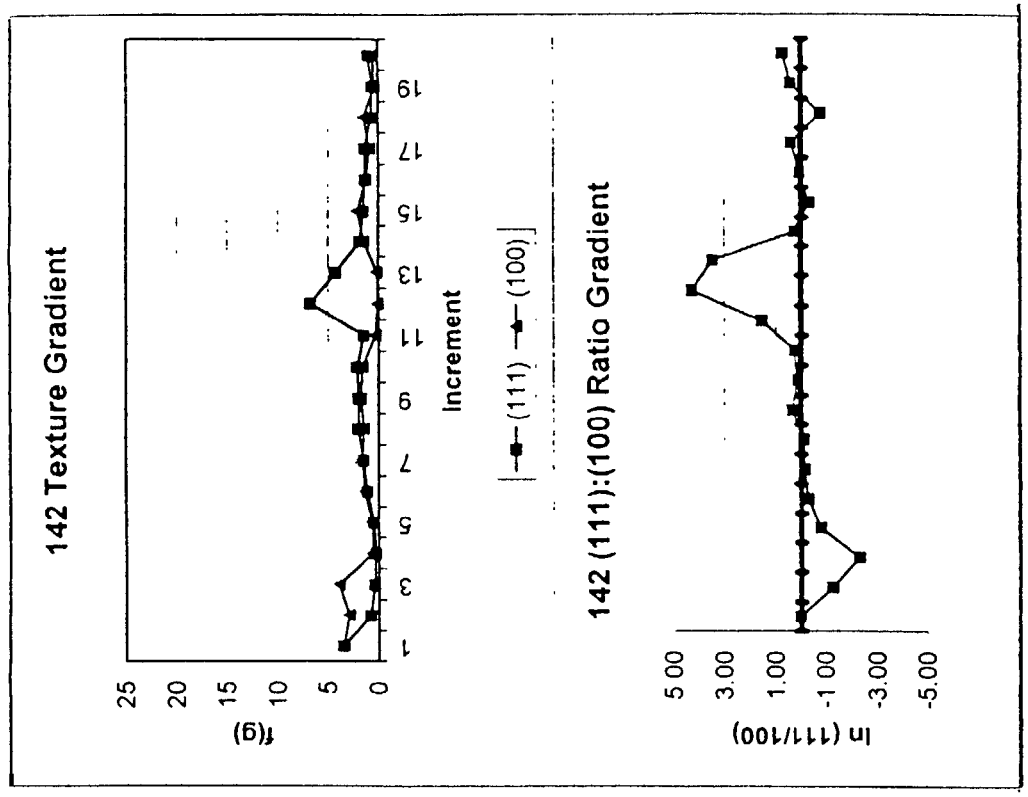
Figures 3A, 3B:
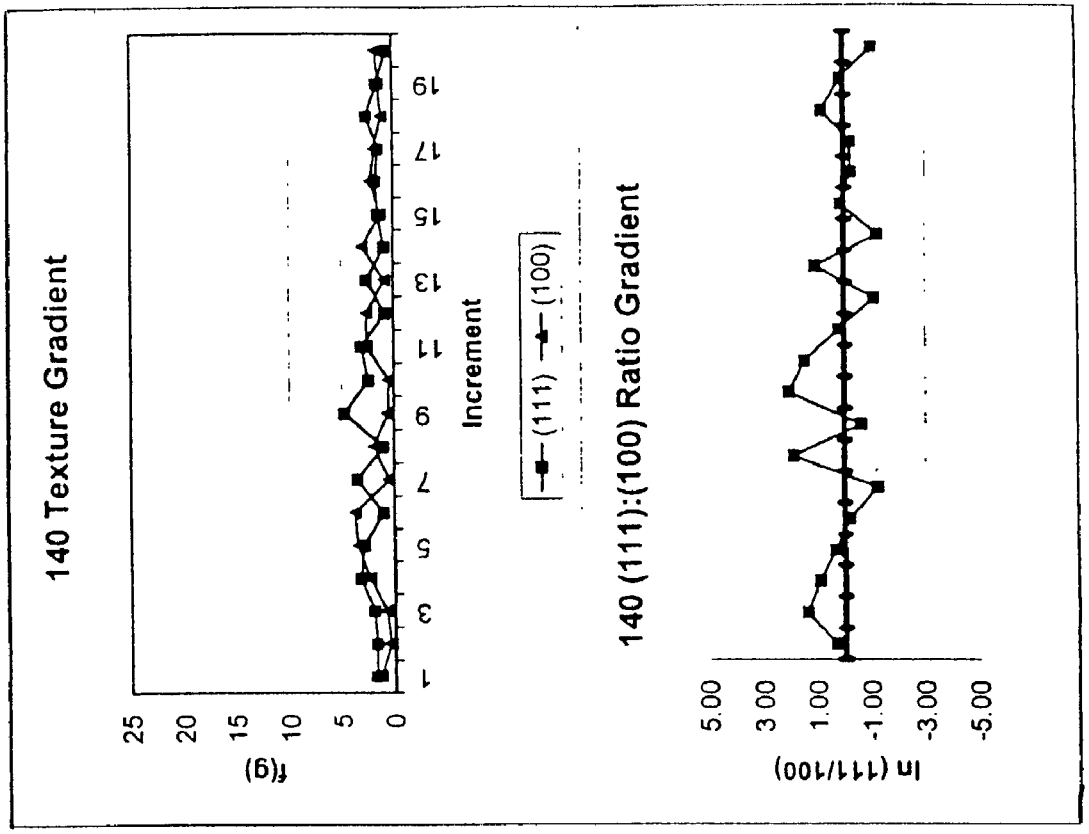
Figures 4A, 4B:
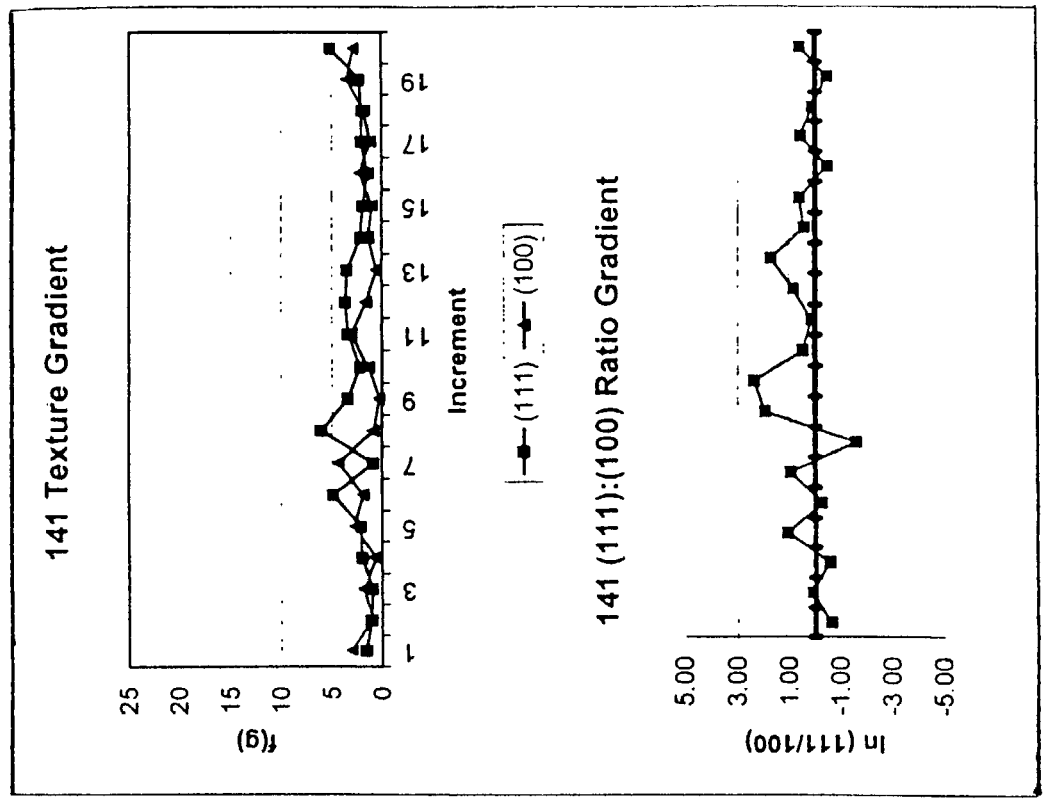
Figures 5A, 5B:
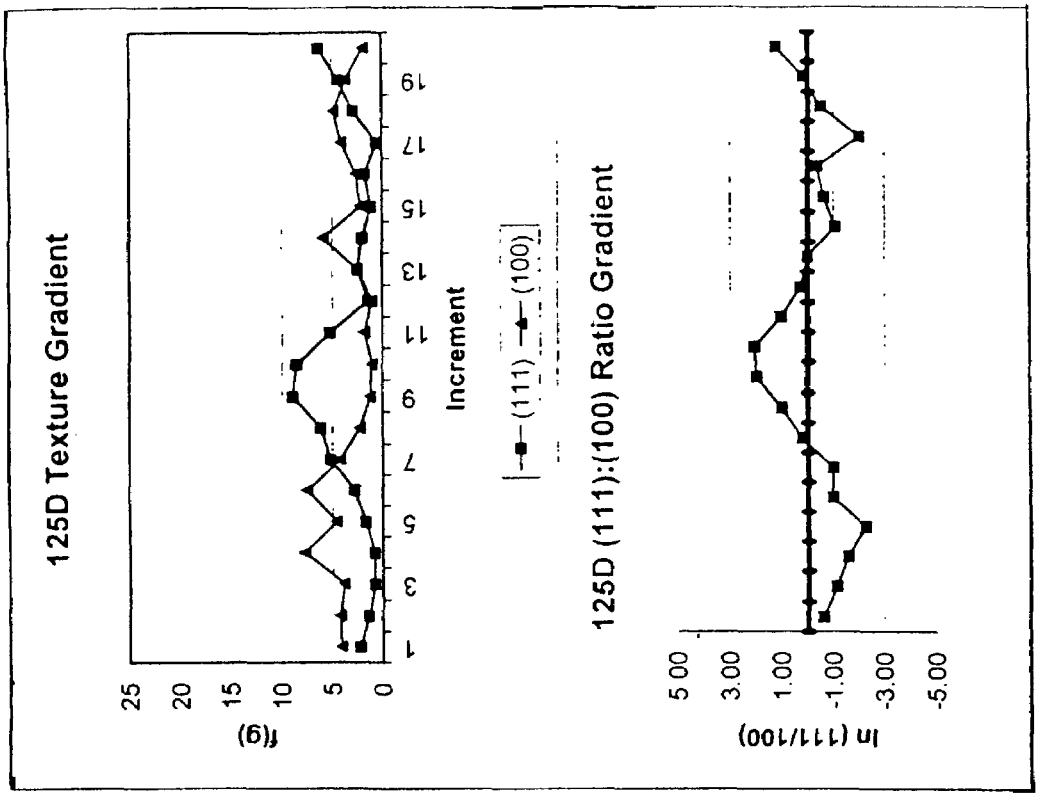
Figures 6A, 6B:
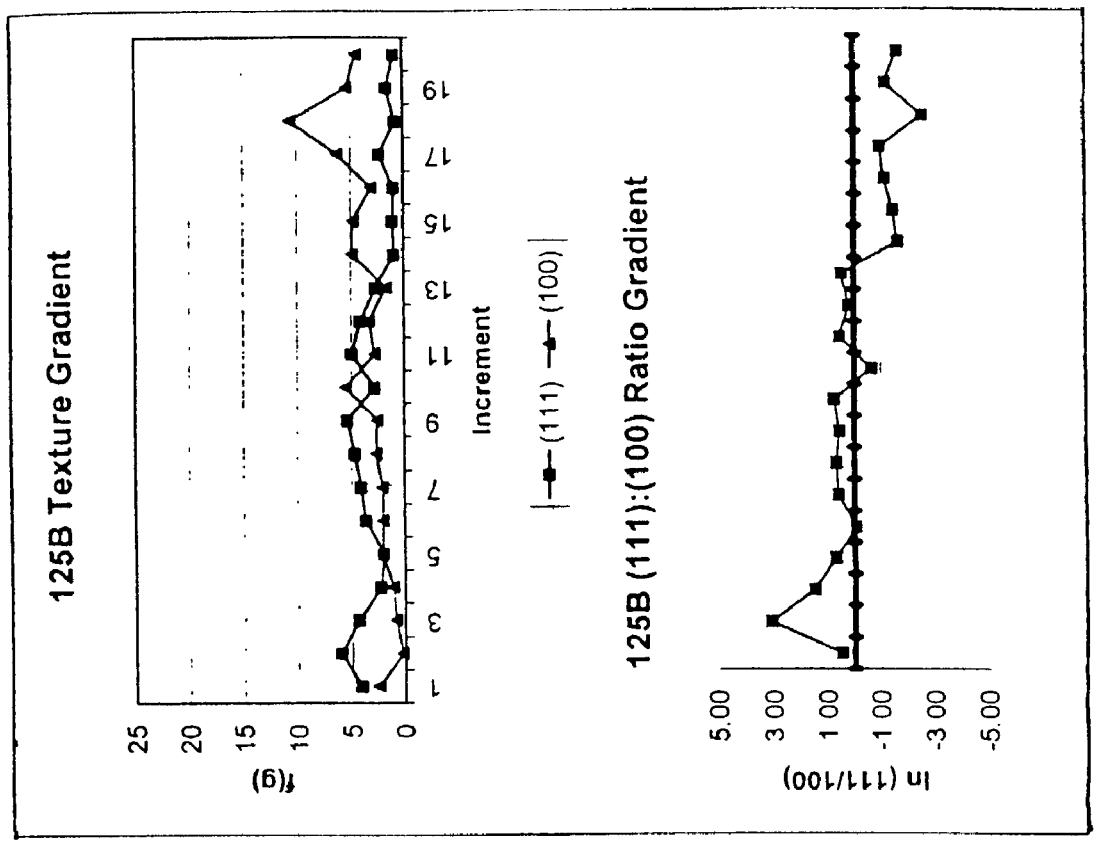
Figures 7A, 7B:
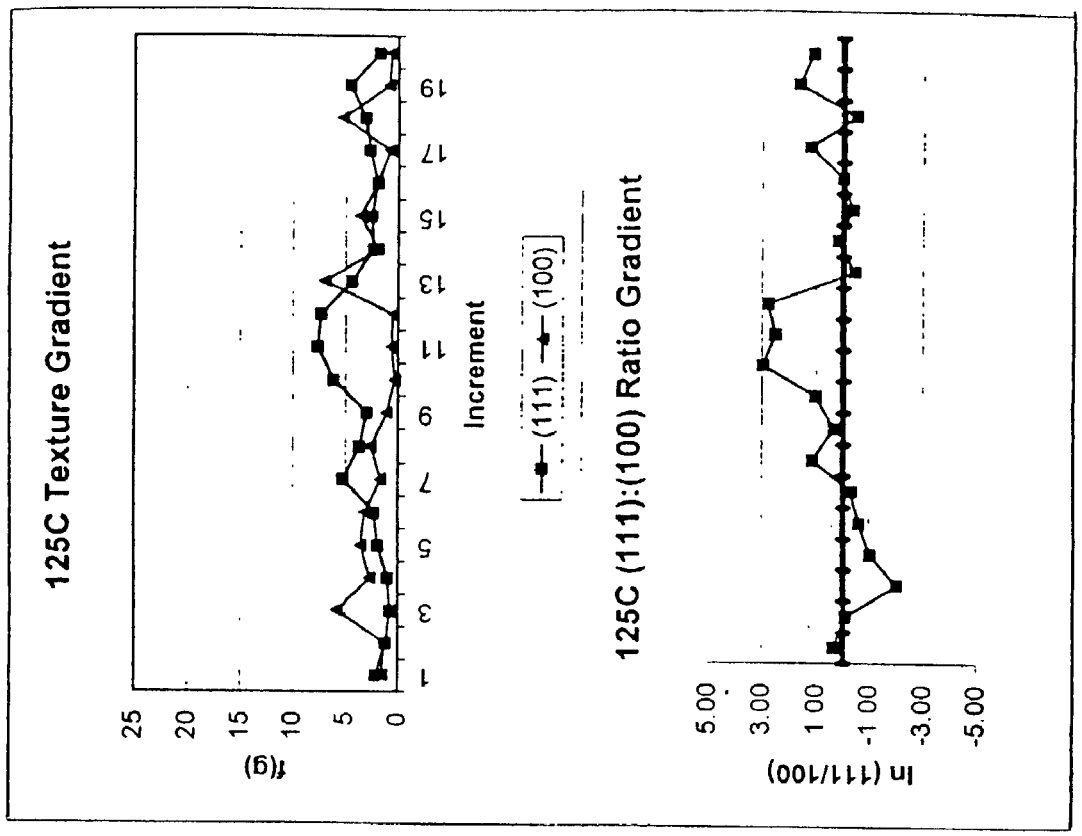
Figures 8A, 8B:
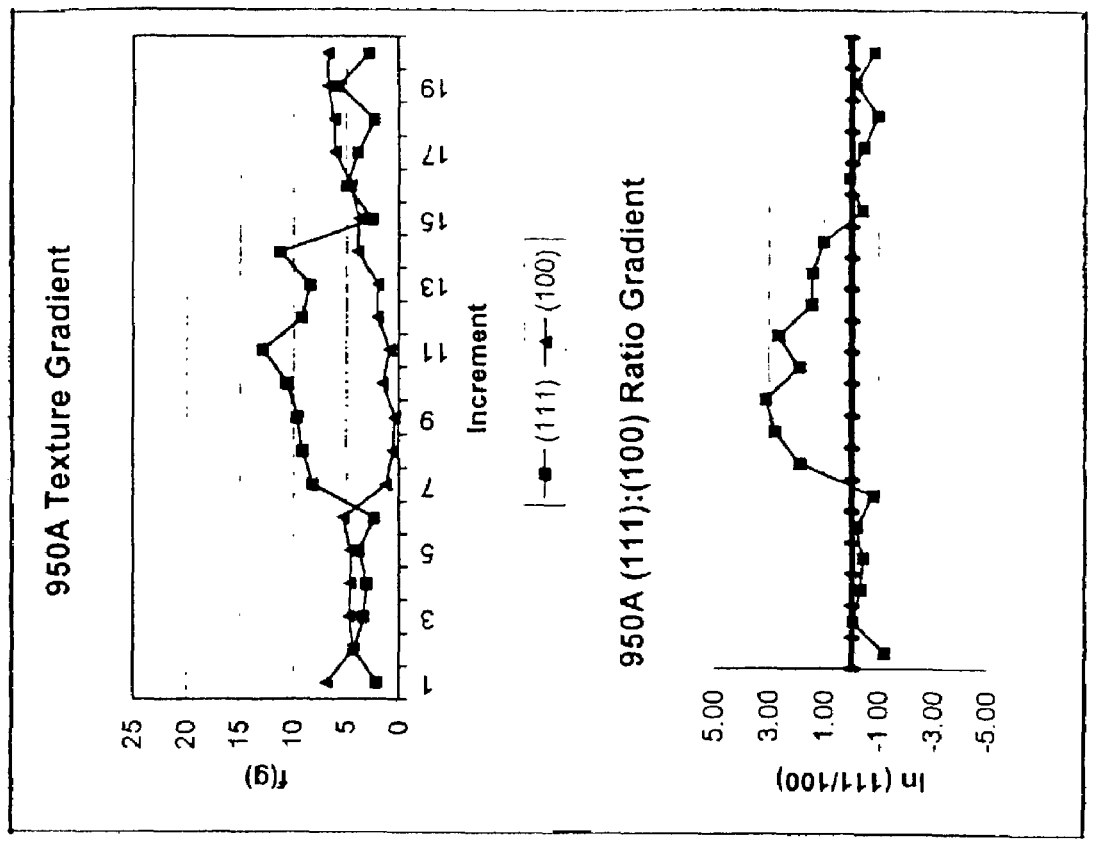
Figures 9A, 9B:
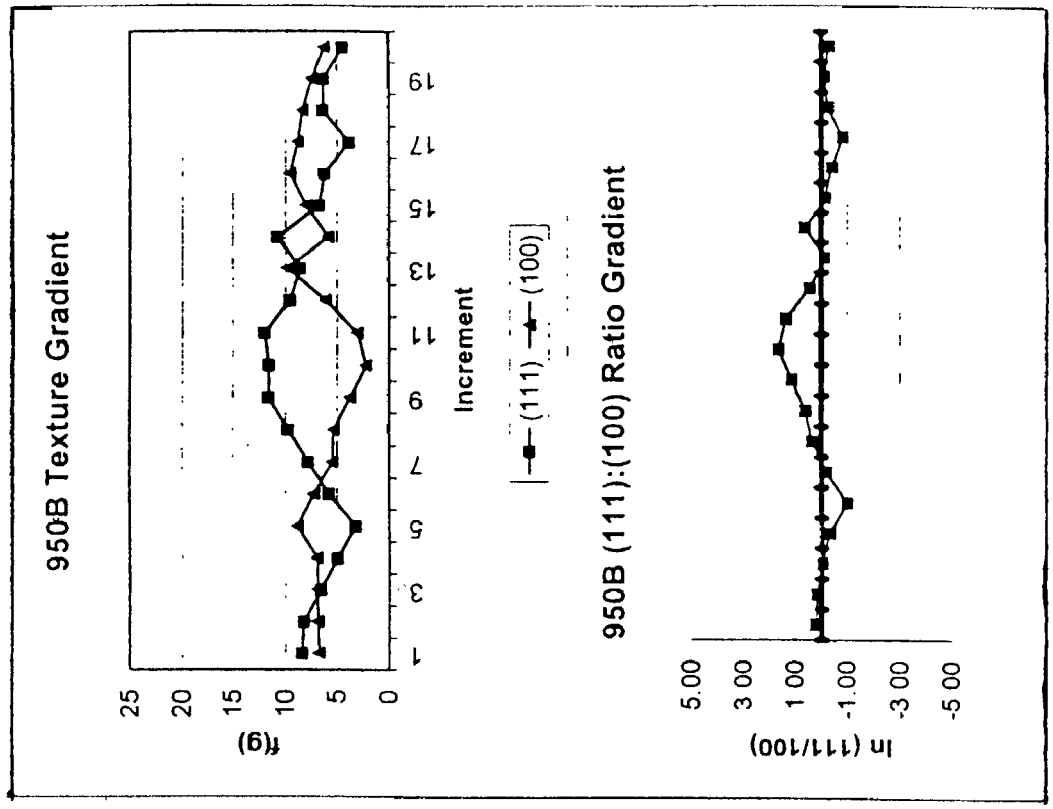

The present invention relates to a tantalum metal having a purity of at least 99.995%. Preferably, the tantalum metal has a purity of at least 99.999% and can range in purity from about 99.995% to about 99.999% or more. Other ranges include about 99.998% to about 99.999% and from about 99.999% to about 99.9992% and from about 99.999% to about 99.9995%. The present invention further relates to a metal alloy which comprises the high purity tantalum metal, such as a tantalum based alloy or other alloy which contains the high purity tantalum as one of the components of the alloy.

The impurities that may be present in the high purity tantalum metal are less than or equal to 0.005% and typically comprise other body-centered cubic (bcc) refractory metals of infinite solubility in tantalum, such as niobium, molybdenum, and tungsten.

The tantalum metal and alloys thereof containing the tantalum metal preferably have a texture which is advantageous for particular end uses, such as sputtering. In other words, when the tantalum metal or alloy thereof is formed into a sputtering target having a surface and then sputtered, the texture of the tantalum metal in the present invention leads to a sputtering target which is easily sputtered and, very few if any areas in the sputtering target resist sputtering. Further, with the texture of the tantalum metal of the present invention, the sputtering of the sputtering target leads to a very uniform sputtering erosion thus leading to a sputtered film which is therefore uniform as well. It is preferred that the tantalum having any purity, but preferably a purity of at least about 99.995%, has a grain size of about 150 microns or less. Preferably, the tantalum metal is at least partially recrystallized, and more preferably at least about 80% of the tantalum metal is recrystallized and even more preferably at least about 98% of the tantalum metal is recrystallized. Most preferably, the tantalum metal is fully recrystallized.

Also, it is preferred that the tantalum metal have a fine texture. More preferably the texture is such that the (100) peak intensity within any 5% incremental thickness of the tantalum is less than about 15 random, and/or has a natural log (Ln) ratio of (111):(100) center peak intensities within the same increment greater than about −4.0 (i.e., meaning, −4.0, −3.0, −2.0, −1.5, −1.0 and so on) or has both the (100) centroid intensity and the ratio. The center peak intensity is preferably from about 0 random to about 10 random, and more preferably is from about 0 random to about 5 random. Other (100) centroid intensity ranges include, but are not limited to, from about 1 random to about 10 random and from about 1 random to about 5 random. Further, the log ratio of (111):(100) center peak intensities is from about −4.0 to about 15 and more preferably from about −1.5 to about 7.0. Other suitable ranges of log ratios, include, but are not limited to, about −4.0 to about 10, and from about −3.0 to about 5.0. Most preferably, the tantalum metal has the desired purity of at least about 99.995% and the preferred grain size and preferred texture with regard to the (100) incremental intensity and the (111):(100) ratio of incremental centroid intensities.

The method and equipment that can be used to characterize the texture are described in Adams et al., Materials Science Forum, Vol. 157-162 (1994), pp. 31-42; Adams et al., Metallurgical Transactions A, Vol 24A, April 1993-No. 4, pp.819-831; Wright et al., International Academic Publishers, 137 Chaonei Dajie, Beijing, 1996 ("Textures of Material: Proceedings of the Eleventh International Conference on Textures of Materials); Wright, Journal of Computer-Assisted Microscopy, Vol. 5, No. 3 (1993), all incorporated in their entirety by reference herein.

The high purity tantalum metal of the present invention can be used in a number of areas. For instance, the high purity tantalum metal can be made into a sputtering target or into chemical energy (CE) munition warhead liner which comprises the high purity metal. The high purity metal can also be used and formed into a capacitor anode or into a resistive film layer. The tantalum metal of the present invention can be used in any article or component which conventional tantalum is used and the methods and means of making the various articles or components containing the conventional tantalum can be used equally here in incorporating the high purity tantalum metal into the various articles or components. For instance, the subsequent processing used in making sputtering targets, such as the backing plate, described in U.S. Pat. Nos. 5,753,090, 5,687,600, and 5,522,535 can be used here and these patents are incorporated in their entirety by reference herein.

Generally, a process that can be used to make the high purity tantalum metal of the present invention involves a refining process, a vacuum melting process, and a thermal mechanical process. In this process or operation, the refining process involves the steps of extracting tantalum metal preferably in the form a powder from ore containing tantalum and preferably the ore-containing tantalum selected has low amounts of impurities, especially, low amounts of niobium, molybdenum, and tungsten. More preferably, the amount of niobium, molybdenum, and tungsten is below about 10 ppm, and most preferably is below about 8 ppm. Such a selection leads to a purer tantalum metal. After the refining process, the vacuum melting process is used to purge low melting point impurities, such as alkyde and transition metals from the tantalum while consolidating the tantalum material into a fully dense, malleable ingot. Then, after this process, a thermal mechanical process can be used which can involve a combination of cold working and annealing of a tantalum which further ensures that the preferred grain size and/or preferred texture and uniformity are achieved, if desired.

The high purity tantalum metal preferably may be made by reacting a salt-containing tantalum with at least one agent (e.g., compound or element) capable of reducing this salt to the tantalum metal and further results in the formation of a second salt in a reaction container. The reaction container can be any container typically used for the reaction of metals and should withstand high temperatures on the order of about 800° C. to about 1,200° C. For purposes of the present invention, the reaction container or the liner in the reaction container, which comes in contact with the salt-containing tantalum and the agent capable of reducing the salt to tantalum, is made from a material having the same or higher vapor pressure as tantalum at the melting point of the tantalum. The agitator in the reaction container can be made of the same material or can be lined as well. The liner can exist only in the portions of the reaction container and agitator that come in contact with the salt and tantalum. Examples of such metal materials which can form the liner or reaction container include, but are not limited to, metal-based materials made from nickel, chromium, iron, manganese, titanium, zirconium, hafnium, vanadium, ruthenium, cobalt, rhodium, palladium, platinum, or any combination thereof or alloy thereof as long as the alloy material has the same or higher vapor pressure as the melting point of tantalum metal. Preferably, the metal is a nickel or a nickel-based alloy, a chromium or a chromium-based alloy, or an iron or an iron-based alloy. The liner, on the reaction container and/or agitator, if present, typically will have a thickness of from about 0.5 cm to about 3 cm. Other thicknesses can be used. It is within the bounds of the present invention to have multiple layers of liners made of the same or different metal materials described above.

The salt-containing tantalum can be any salt capable of having tantalum contained therein such as a potassium-fluoride tantalum. With respect to the agent capable of reducing the salt to tantalum and a second salt in the reaction container, the agent which is capable of doing this reduction is any agent which has the ability to result in reducing the salt-containing tantalum to just tantalum metal and other ingredients (e.g. salt(s)) which can be separated from the tantalum metal, for example, by dissolving the salts with water or other aqueous sources. Preferably, this agent is sodium. Other examples include, but are not limited to, lithium, magnesium, calcium, potassium, carbon, carbon monoxide, ionic hydrogen, and the like. Typically, the second salt which also is formed during the reduction of the salt-containing tantalum is sodium fluoride. Details of the reduction process which can be applied to the present invention in view of the present application are set forth in Kirk-Othmer, Encyclopedia of Chemical Technology, $3^{rd}$ Edition, Vol 22, pp. 541-564, U.S. Pat. Nos. 2,950,185; 3,829,310; 4,149,876; and 3,767,456. Further details of the processing of tantalum can be found in U.S. Pat. Nos. 5,234,491; 5,242,481; and 4,684,399. All of these patents and publications are incorporated in their entirety by reference herein.

The above-described process can be included in a multi-step process which can begin with low purity tantalum, such as ore-containing tantalum. One of the impurities that can be substantially present with the tantalum is niobium. Other impurities at this stage are tungsten, silicon, calcium, iron, manganese, etc. In more detail, low purity tantalum can be purified by mixing the low purity tantalum which has tantalum and impurities with an acid solution. The low purity tantalum, if present as an ore, should first be crushed before being combined with an acid solution. The acid solution should be capable of dissolving substantially all of the tantalum and impurities, especially when the mixing is occurring at high temperatures.

Once the acid solution has had sufficient time to dissolve substantially, if not all, of the solids containing the tantalum and impurities, a liquid solid separation can occur which will generally remove any of the undissolved impurities. The solution is further purified by liquid-liquid extraction. Methyl isobutyl ketone (MIBK) can be used to contact the tantalum rich solution, and deionized water can be added to create a tantalum fraction. At this point, the amount of niobium present in the liquid containing tantalum is generally below about 25 ppm.

Then, with the liquid containing at least tantalum, the liquid is permitted to crystallize into a salt with the use of vats. Typically, this salt will be a potassium tantalum fluoride salt. More preferably, this salt is $K_2TaF_7$. This salt is then reacted with an agent capable of reducing the salt into 1) tantalum and 2) a second salt as described above. This compound will typically be pure sodium and the reaction will occur in a reaction container described above. As stated above, the second salt byproducts can be separated from the tantalum by dissolving the salt in an aqueous source and washing away the dissolved salt. At this stage, the purity of the tantalum is typically 99.50 to 99.99% Ta.

Once the tantalum powder is extracted from this reaction, any impurities remaining, including any contamination from the reaction container, can be removed through melting of the tantalum powder.

The tantalum powder can be melted a number of ways such as a vacuum arc remelt or an electron beam melting. Generally, the vacuum during the melt will be sufficient to remove substantially any existing impurities from the recovered tantalum so as to obtain high purity tantalum. Preferably, the melting occurs in a high vacuum such as $10^{-4}$ torr or more. Preferably, the pressure above the melted tantalum is lower than the vapor pressures of the metal impurities in order for these impurities, such as nickel and iron to be vaporized. The diameter of the cast ingot should be as large as possible, preferably greater than 9½ inches. The large diameter assures a greater melt surface to vacuum interface which enhances purification rates. In addition, the large ingot diameter allows for a greater amount of cold work to be imparted to the metal during processing, which improves the attributes of the final products. Once the mass of melted tantalum consolidates, the ingot formed will have a purity of 99.995% or higher and preferably 99.999% or higher. The electron beam processing preferably occurs at a melt rate of from about 300 to about 800 lbs. per hour using 20,000 to 28,000 volts and 15 to 40 amps, and under a vacuum of from about $1\times10^{-3}$ to about $1\times10^{-6}$ Torr. More preferably, the melt rate is from about 400 to about 600 lbs. per hour using from 24,000 to 26,000 volts and 17 to 36 amps, and under a vacuum of from about $1\times10^{-4}$ to $1\times10^{-5}$ Torr. With respect to the VAR processing, the melt rate is preferably of 500 to 2,000 lbs. per hour using 25-45 volts and 12,000 to 22,000 amps under a vacuum of $2\times10^{-2}$ to $1\times10^{-4}$ Torr, and more preferably 800 to 1200 lbs. per hour at from 30 to 60 volts and 16,000 to 18,000 amps, and under a vacuum of from $2\times10^{-2}$ to $1\times10^{-4}$ Torr.

The high purity tantalum ingot can then be thermomechanically processed to produce the high purity tantalum containing product. The fine, and preferably fully recrystallized, grain structure and/or uniform texture is imparted to the product through a combination of cold and/or warm working and in-process annealing. The high purity tantalum product preferably exhibits a uniform texture of mixed or primary (111) throughout its thickness as measured by orientation imaging microscopy (OIM) or other acceptable means. With respect to thermomechanical processing, the ingot can be subjected to rolling and/or forging processes and a fine, uniform microstructure having high purity can be obtained. The high purity tantalum has an excellent fine grain size and/or a uniform distribution. The high purity tantalum preferably has an average recrystallized grain size of about 150 microns or less, more preferably about 100 microns or less, and even more preferably about 50 microns or less. Ranges of suitable average grain sizes include from about 25 to about 150 microns; from about 30 to about 125 microns, and from about 30 to about 100 microns.

The resulting high purity metal of the present invention, preferably has 10 ppm or less metallic impurities and preferably 50 ppm or less $O_2$, 25 ppm or less $N_2$, and 25 ppm or less carbon. If a purity level of about 99.995 is desired, than the resulting high purity metal preferably has metallic impurities of about 50 ppm or less, and preferably 50 ppm or less $O_2$, 25 ppm or less $N_2$, and 25 ppm or less carbon.

With respect to taking this ingot and forming a sputtering target, the following process can be used. In one embodimentm, the sputtering target made from the high purity tantalum metal can be made by mechanically or chemically cleaning the surflices of the tantalum metal, wherein the tantalum metal has a sufficient starting cross-sectional area to permit the subsequent processing steps described below. Preferably the tantalum metal has a diameter of at least 9 ½ inches or more. The next step involves flat forging the tantalum metal into one or more rolling slabs. The rolling slab(s) has a sufficient deformation to achieve substantially uniform recrystallization after the annealing step immediately following this step as described below. The rolling slab(s) is then annealed in vacuum and at a sufficient temperature to achieve at least partial recystallization of the rolling slab(s). Preferred annealing temperatures and times are set forth below and in the examples. The rolling slab(s) is then subjected to cold or warm rolling in both the perpendicular and parallel directions to the axis of the starting tantalum metal (e.g., the tantalum ingot) to form at least one plate. The plate is then subjected to flattening (e.g., level rolling). The plate is then annealed a final time at a sufficient temperature and for a sufficient time to have an average grain size of equal to or less than about 150 microns and a texture substantially void of (100) textural bands. Preferably, no (100) textural bands exist. The plate can then be mechanically or chemically cleaned again and formed into the sputtering target having any desired dimension. Typically, the flat forging will occur after the tantalum metal is placed in air for at least about 4 hours at temperatures ranging from ambient to about 370° C. Also, preferably before cold rolling, the rolling slabs are annealed at a temperature (e.g., from about 950° C. to about 150° C.) and for a time (e.g., from about Vz hour to about 8 hours) to achieve at least partial recrystallization of the tantalum metal. Preferably the cold rolling is transverse rolling at ambient temperatures and the warm rolling is at temperatures of less than about 370° C.

With respect to annealing of the tantalum plate, preferably this annealing is in a vacuum annealing at a temperature and for a time sufficient to achieve complete recrystallization of the tantalum metal. The examples in this application set forth further preferred details with respect to this processing.

Another way to process the tantalum metal into sputtering targets involves mechanically or chemically clean surfaces of the tantalum metal (e.g., the tantalum ingot), wherein the tantalum metal has a sufficient starting cross-sectional area to permit the subsequent processing as described above. The next step involves round forging the tantalum metal into at least one rod, wherein the rod has sufficient deformation to achieve substantially uniform recrystallization either after the annealing step which occurs immediately after this step or the annealing step prior to cold rolling. The tantalum rod is then cut into billets and the surfaces mechanically or chemically cleaned. An optional annealing step can occur afterwards to achieve at least partial recrystallization. The billets are then axially forged into preforms. Again, an optional annealing step can occur afterwards to achieve at least partial recrystallization. However, at least one of the optional annealing steps or both are done. The preforms are then subjected to cold rolling into at least one plate. Afterwards, the surfaces of the plate(s) can be optionally mechanically or chemically clean. Then, the final annealing step occurs to result in an average grain size of about 150 microns or less and a texture substantially void of (100) textural bands, if not totally void of (100) textural bands. The round forging typically occurs after subjecting the tantalum metal to temperatures of about 370° C. or lower. Higher temperatures can be used which results in increased oxidation of the surface. Preferably, prior to forging the billets, the billets are annealed. Also, the preforms, prior to cold rolling can be annealed. Typically, these annealing temperatures will be from about 900° C. to about 1200° C. Also, any annealing is preferably vacuum annealing at a sufficient temperature and for a sufficient time to achieve recrystallization of the tantalum metal.

Preferably, the sputtering targets made from the high purity tantalum have the following dimensions: a thickness of from about 0.080 to about 1.50", and a surface area from about 7.0 to about 1225 square inches.

The high purity tantalum preferably has a primary or mixed (111) texture, and a minimum (100) texture throughout the thickness of the sputtering target, and is sufficiently void of (100) textural bands.

The present invention will be further clarified by the following examples, which are intended to be purely exemplary of the present invention.

EXAMPLES

Example 1

Numerous sublots of sodium-reduced commercial-grade tantalum powder, each weighing about 200-800 lbs., were chemically analyzed for suitability as 99.999% Ta feedstock for electron beam melting. Representative samples from each powder lot were analyzed by Glow Discharge Mass Spectrometry (GDMS): powder sublots having combined niobium (Nb), molybdenum (Mo), and tungsten (W) impurity content less than 8 ppm were selected for melting.

The selected Ta powder sublots were then blended in a V-cone blender to produce a homogeneous 4000 pound powder master lot, which was again analyzed by GDMS to confirm purity. Next, the powder was cold isostatically pressed (CIP'ed) into green logs approximately 5.5"-6.5" in diameter, each weighing nominally 300 pounds. The pressed logs were then degassed by heating at 1450° C. for 2 hours at a vacuum level of about $10^{-3}$-$10^{-5}$ torr. For this operation, the logs were covered with tantalum sheets to prevent contamination from the furnace elements.

The degassed logs were then side fed into a 1200KW EB furnace and drip melted at a rate of 400 lbs./hr. into a 10" water-cooled copper crucible under a vacuum less than $10^{-3}$ torr. Once cooled, the resulting first-melt ingot was inverted, hung in the same furnace, and remelted using the same EB melting parameters. The $2^{nd}$ melt ingot was again inverted and remelted a third time, but into a 12" crucible at a melt rate of 800 lbs./hr.

A sample was taken from the sidewall of the resulting ingot for chemical analysis by Glow Discharge Mass Spectrometry (GDMS). Results confirmed that the Ta ingot was 99.9992% pure.

Example 2

A potassium fluotantalate ($K_2TaF_7$) was obtained and upon spark source mass spec analysis, the $K_2TaF_7$ exhibited 5 ppm or less niobium. Levels of Mo and W were also analyzed by spectrographic detection and levels were below 5 ppm for Mo and below 100 ppm for W. In particular, the $K_2TaF_7$ had levels of Nb of 2 ppm or less, of Mo of less than 1 ppm and of W of less than or equal to 2 ppm. In each sample, the total recorded amount of Nb, Mo, and W was below 5 ppm. Four lots of 2,200 lbs. each were analyzed.

One of the lots was transferred to KDEL reactor which used a pure nickel vessel and a Hastelloy X agitator. The Hastelloy X agitator contained 9% Mo and 0.6% W. The shaft and paddles of the agitator were then shielded with ¹⁄₁₆" nickel sheet using welding to clad all surfaces exposed to the reaction.

A standard sodium reduction process was used except as noted below. The lot was subjected to the agitator in the presence of pure sodium to form tantalum powder. The tantalum powder was then washed with water and subjected to acid treating and then steam drying and then screening to −100 mesh.

A sample from each batch was then submitted for glow discharge mass spec analysis. The two tables (Tables 1 and 2) below show the starting analysis for the $K_2TaF_7$ and the final analysis of the tantalum recovered.

TABLE 1

$K_2TaF_7$ Spark Source Mass Spec (SSMS) Analysis (metal to salt basis)

| Sample Number | Nb (ppm) | Mo (ppm) | W (ppm) | TOTAL (ppm) |
|---|---|---|---|---|
| 1 | 2 | <1 | ≦2 | <5 |
| 2 | 1 | <1 | ≦2 | <4 |
| 3 | 2 | <1 | ≦2 | <5 |
| 4 | 1 | <1 | ≦2 | <4 |

TABLE 2

Ta Powder Glow Discharge Mass Spec (GDMS) Analysis

| Sample Number | Nb (ppm) | Mo (ppm) | W (ppm) | TOTAL (ppm) |
|---|---|---|---|---|
| 5 | 1.4 | 0.38 | 0.27 | 2.05 |
| 6 | 1.2 | 0.30 | 0.50 | 2.00 |
| 7 | 1.0 | 0.25 | 0.29 | 1.54 |
| 8 | 1.1 | 0.15 | 0.28 | 1.53 |

As can be seen in the above tables, a high purity tantalum powder suitable for electron beam melting into an ingot can be obtained and purities on the order of 99.999% purity can be obtained by the processing shown in Example 1.

Example 3

Two distinct process methodologies were used. First, a 99.998% pure tantalum ingot was used which was subjected to three electron beams melts to produce a 12 inch nominal diameter ingot. The ingot was machined clean to about 11½ inch diameter and then heated in air to about 260° C. for 4-8 hours. The ingot was then flat forged, cut, and machined into slabs (approximately 4 inch by 10 inch with a length of approximately 28 inch to 32 inch) and then acid cleaned with $HF/HNO_3$/water solution. The slabs were annealed at 1050, 1150, and 130° C. under vacuum of $5\times10^{-4}$ Torr for 2 hours, then cold rolled into plate stock of 0.500 and 0.250" gauge. This cold rolling was accomplished by taking a 4 inch thick by 10 inch wide by 30 inch long slab and rolling it perpendicular to the ingot axis at 0.200 inch per pass to 31 inches wide. The plate was then rolled parallel to the ingot axis at 0.100 inch per pass to 0.650 inch thick or 0.500 inch thick. Both rollings were done on a 2-High breakdown rolling mill. Each of the plates were rolled by multiples passes of 0.050 inch per pass and then 0.025 inch per pass with final adjustments to meet a finish gauge of 0.500 inch plate or 0.250 inch plate, using a four high finishing rolling mill. The plates were then subjected to a final annealing at temperatures of from 950-1150° C.

The alternative process began with a 99.95% pure Ta which was subjected to three electron beam melts to produce an ingot as described above prior to being forged. The ingot was then round forged using a GFM rotary forge to 4" diameter after multiples passes of about 20% reduction in area per pass. From this intermediate stock, 4 billets (3.75"Ø×7" long) were machined, and 2 billets (labeled A and B) were annealed at 1050° C. while billets C and D remained unannealed. Next, the billets were upset forged to preforms of height of 2.5", after which preforms A and C were annealed at 1050° C. The preforms were then clock rolled to a thickness of about 0.400" to yield discs of a diameter of approximately 14". This was accomplished by taking multiple passes of 0.200 inch per pass to about 0.5250 inch thick. The discs were then rolled to about 0.5 inch thick by multiple passes of 0.100 inch per pass. Then, the discs were clocked rolled on a four high finishing mill in three passes of 0.050 inch, 0.025 inch, and 0.015 inch reductions per pass to yield a disc of about 0.400 inch thick by about 14 inch diameter. A quarter of the disc was cut into four wedges and final annealed at temperatures of 950-1100° C. Table 4 below summarizes this processing.

Metallographic and texture analysis was conducted on longitudinal sections of the plate material (measurement face parallel to the final rolling direction) and on radial sections of the forged and rolled discs (measurement face parallel to the radius of the discs).

Metallurgical Analysis

Grain size and texture were measured along the longitudinal or radial directions of samples taken from rolled plate and forged and rolled discs, respectively. Grain size was measured using ASTM procedure E-112. Results from the annealing studies on products produced via the flat and round processes are given in Tables 3 and 4, respectively. Intermediate annealing treatments had no noticeable influence on the grain size of the finished product. Also, for plate, the final grain sizes of 0.500 and 0.250" thick tantalum were comparable. The only variable found to significantly effect the grain size of the materials was the final anneal temperature: the higher the final anneal temperature, the larger the resulting grain size.

In plate, grain sizes of ASTM 6.5-7.0 were measured in samples from product annealed at 1000 and 950° C. However, each of these samples showed evidence of elongated and/or unrecrystallized regions at or near the surface, and recrystallization values were reported to be 98-99%. For plates annealed at 1050, 1100, and 1150° C., ASTM grain sizes ranged from 5.3 to 3.7, with all samples being 100% recrystallized.

For the round-processed discs, all samples were reported to be 100% recrystallized, with the exception of Disc C annealed at 950° C. which was 99% recrystallized. Grain sizes of ASTM 7.1-7.2, 6.1-6.8, and 5.9-5.9 were measured in the disc samples annealed at 950, 1000, and 1050° C., respectively. Annealing at 1100° C. produced grain sizes of ASTM 4.0-4.5.

For both processes, these findings demonstrate that a fully recrystallized grain size of 50 μm or finer is achievable using either the plate rolling or the billet forging process at a preferred final anneal temperature of from about 950 to about 1050° C. Should the unrecrystallized areas be limited to only the surface regions of the plate, then they can be removed by machining.

Texture Measurement Technique:

A limited number of samples (chosen based on metallurgical results) were used for texture analysis. Mounted and polished samples, previously prepared for metallurgical analysis, were employed as texture samples after being given a heavy acid etch prior to texture measurement. Orientation Imaging Microscopy (OIM) was chosen as the method of texture analysis because of its unique ability to determine the orientation of individual grains within a polycrystalline sample. Established techniques such as X-ray or neutron diffraction would have been unable to resolve any localized texture variations within the thickness of the tantalum materials.

For the analysis, each texture sample was incrementally scanned by an electron beam (within an SEM) across its entire thickness; the backscatter Kikuchi patters generated for each measurement point was then indexed using a computer to determine the crystal orientation. From each sample, a rawdata file containing the orientations for each data point within the measurement grid array was created. These files served as the input data for subsequently producing grain orientation maps and calculating pole figures and orientation distribution functions (ODFs).

By convention, texture orientations are described in reference to the sample-normal coordinate system. That is, pole figures are "standardized" such that the origin is normal to the plate surface, and the reference direction is the rolling (or radial) direction; likewise, ODFs are always defined with respect to the sample-normal coordinate system. Terminology such as "a (111) texture" means that the (111) atomic planes are preferentially oriented to be parallel (and the (111) pole oriented to be normal) with the surface of the plate. In the analyses, the crystal orientations were measured with respect to the sample longitudinal direction. Therefore, it was necessary to transpose the orientation data from the longitudinal to sample-normal coordinate system as part of the subsequent texture analysis. These tasks were conducted through use of computer algorithms.

Grain Orientation Maps:

Derived from principles of presenting texture information in the form of inverse pole figures, orientation maps are images of the microstructure within the sample where each individual grain is "color-coded" based on its crystallographic orientation relative to the normal direction of the plate of disc from which it was taken. To produce these images, the crystal axes for each grain (determined along the longitudinal direction of the texture sample by OIM) were tilted 90° about the transverse direction so to align the crystal axes to the normal direction of the sample. Orientation maps serve to reveal the presence of texture bands or gradients through the thickness on the product; in tantalum, orientation maps have shown that large, elongated grains identified by optical microscopy can be composed of several small grains with low-angle grain boundaries.

Analysis of the Texture Results:

OIM scans were taken along the thickness of each sample provided; for the 0.500" plate samples, separate measurements were made for the top and the bottom portions of the plate and reported separately.

Figures 11A, 11B:
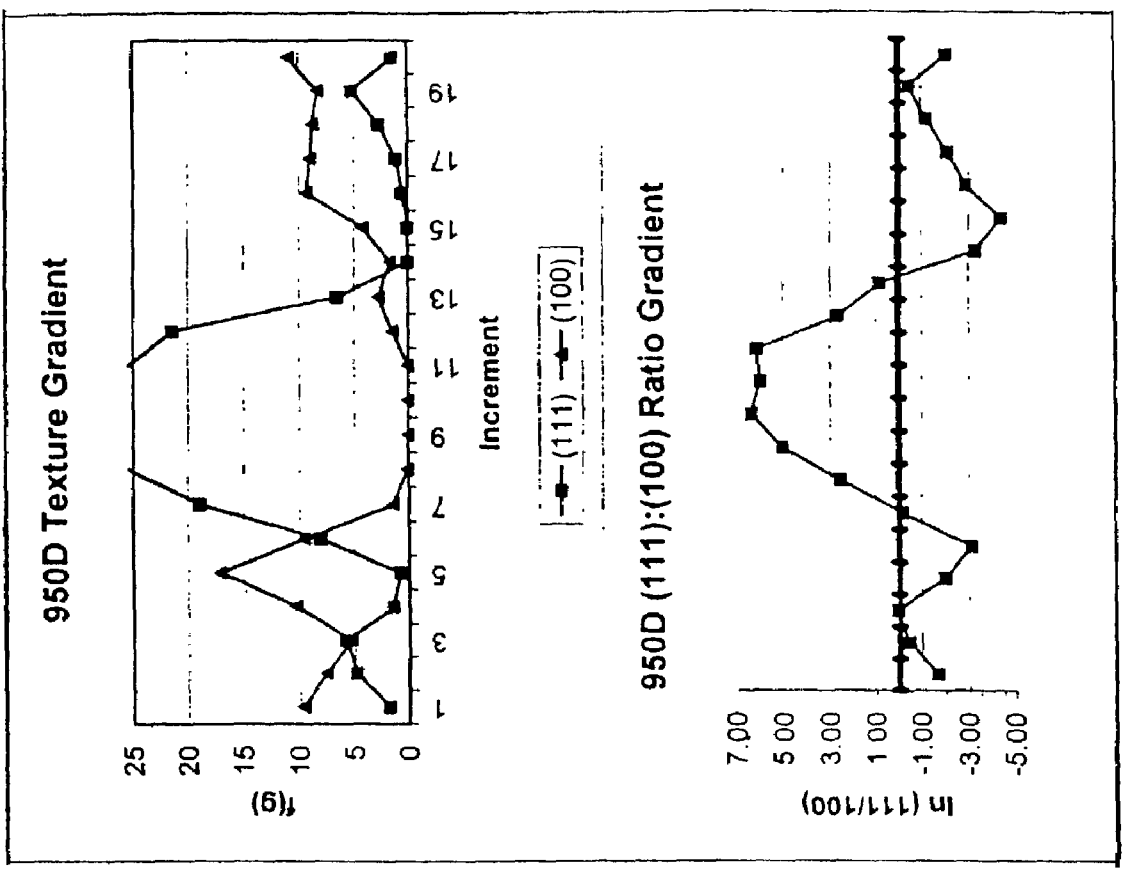

The orientation maps were visually examined to qualitatively characterize the texture uniformity through the sample thickness. To attain a quantifiable description of the texture gradients and texture bands in the example materials, the measured EBSD data was partitioned into 20 subsets, with each representing a 5% increment of depth through the thickness of the sample. For each incremental data set, an ODF was first calculated, then (100) and (111) centroid intensities determined numerically using techniques reported elsewhere. The equipment and procedures described in S. Matthies et al., Materials Science Forum, Vol. 157-162 (1994), pp. 1647-1652 and S. Matthies et al., Materials Science Forum, Vol. 157-162 (1994), pp. 1641-1646 were applied, and these publications are incorporated in their entirety herein by reference. The texture gradients were then described graphically by plotting the (100) and (111) intensities, as well as the log ratio of the (100):(111), as a function depth of the sample. These results are set forth in FIGS. 1(A and B) through FIGS. 11(A and B).

The heavy-gauge tantalum plate exhibited the most uniform through thickness texture; the only sample containing texture bands was that processed with a slab anneal of 1300° C. and a final anneal of 1000° C. In addition, the 0.500" plate materials also had a relative weak (most random) texture base on pole figure and ODF analysis. Compared to the heavy plate, the 0.250' sheets contained a slight to moderate texture gradient and some evidence of texture banding. Also, the thin-gauge plates showed a more defined (111) texture in the ODFs and an increased prominence of (100).

The greatest variability in terms of texture uniformity and banding was found in the forged and rolled discs. Unlike the metallurgical properties, the texture of forged and rolled discs was effected by the use of intermediate annealing. For discs A, B, and C, each of which were processed with one or two intermediate annealing steps, the texture gradients ranged from negligible to strong (depending to processing parameters) with slight—if any—banding. However, for disc D, which was worked from ingot to final discs without intermediate annealing, the resultant product contained less desirable strong texture gradients and sharp texture bands. Similarly, disc C, which was also forged from unannealed billet but then annealed prior to cold rolling, also showed a strong texture gradient and banding in the sample final annealed at 950° C. For disc C, increasing the final anneal temperature to 1100° C. acted to diminish the gradient, eliminated the bands, but strengthening the intensity of (100) texture component. These effects from increasing final annealing temperatures were also evident, but to a lesser degree, in both the other disc materials and the heavy gauge plate.

From the microstructural and textural observations, the following conclusions could be made regarding the optimum processing for fabricating tantalum sputtering targets:

For flat products, slab anneal temperatures preferably do not exceed 1150° C. (1050° C. is more preferred) and the final anneal temperature is preferably kept at 950-1000° C., more preferably 1000° C. The resulting product is characterized as having a recrystallized average grain size of less 50 µm. and a (100) incremental intensity of less than 15 random and a log ratio of (111):(100) of less than −4.0.

For round processing, billets preferably are annealed prior to forging and rolling into disc without use of an intermediate anneal at preform level. Final anneal temperature is preferably 950-1100° C., and more preferably is 1050° C. The resulting product is characterized as having a recrystallized average grain size below 50 µm, and a (100) incremental intensity of less than 15 random and a log ratio of (111):(100) of less than −4.0.

TABLE 3

Metallurgical Characteristics Process

| Slab Anneal Temperature (° C.) | 1050 | | | | 1150 | | | | 1300 | | | |
|---|---|---|---|---|---|---|---|---|---|---|---|---|
| Gauge of Plate Produced from Slab | .250" | | .500" | | .250" | | .500" | | .250" | | .500" | |
| Plate Anneal Temperature (° C.) | ASTM Grain Size | % Recry. | ASTM Grain Size | % Recry. | ASTM Grain Size | % Recry. | ASTM Grain Size | % Recry. | ASTM Grain Size | % Recry. | ASTM Grain Size | % Recry. |
| 950 | 7.0 | 98 | 6.7 | 98 | 7.0 | 98 | 6.7 | 98 | 7.0 | 98 | 6.7 | 98 |
| 1000 | 6.5 | 99 | 6.5 | 99 | 6.5 | 99 | 6.5 | 98 | 6.5 | 99 | 6.5 | 98 |
| 1050 | 4.5 | 100 | 5.0 | 100 | 4.5 | 100 | 5.0 | 100 | 4.5 | 100 | 5.3 | 100 |
| 1050 | 5.0 | 100 | 4.5 | 100 | 5.0 | 100 | 4.5 | 100 | 5.0 | 100 | 4.5 | 100 |
| 1100 | 4.5 | 100 | 5.0 | 100 | 4.5 | 100 | 4.0 | 100 | 4.5 | 100 | 4.0 | 100 |
| 1150 | 4.0 | 100 | 4.0 | 100 | 4.0 | 100 | 3.7 | 100 | 4.0 | 100 | 3.7 | 100 |

Note: Material Purity was 99.998% Ta

TABLE 4

| BILLET A | BILLET B | BILLET C | BILLET D | PC. WEIGHT | |
|---|---|---|---|---|---|
| Anneal 1050 C | Anneal 1050 C | Unannealed | Unannealed | 46.4 lbs | 7"Long |
| Upset Forge | Upset Forge | Upset Forge | Upset Forge | | 6.25" |
| 2.5" Thick | 2.5" Thick | 2.5" Thick | 2.5" Thick | | Diameter |
| Anneal 1050 C | | Anneal 1050 C | | | |
| Machine Clean | Machine Clean | Machine Clean | Machine Clean | 42 lbs | 6" Diameter |
| X-Roll to Gauge 0.400" | X-Roll to Gauge 0.400" | X-Roll to Gauge 0.400" | X-Roll to Gauge 0.400" | | 15" Diameter |
| Saw Cut Quarters | Saw Cut Quarters | Saw Cut Quarters | Saw Cut Quarters | 10.5 lbs/qtr. | |
| Anneal Study | Anneal Study | Anneal Study | Anneal Study | | |

| ANNEAL TEMP(° C.) | ASTM GRAIN SIZE (REX) | | | |
|---|---|---|---|---|
| 950 | 7.1 (100%) | 7.2 (100%) | 7.1 (99%) | 7.2 (100%) |
| 1000 | 6.1 (100%) | 6.5 (100%) | 5.9 (100%) | 6.8 (100%) |
| 1050 | 5.8 (100%) | 5.9 (100%) | 5.9 (100%) | 5.9 (100%) |
| 1100 | 4.5 (100%) | 4.5 (100%) | 4.5 (100%) | 4.0 (100%) |

REX = % Recrystallization

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims.

What is claimed is:

1. A process of making a sputtering component from tantalum metal, comprising:
    a) mechanically or chemically clean surfaces of the tantalum metal, wherein the tantalum metal has a sufficient starting cross-sectional area to permit steps b) through g);
    b) flat forging the tantalum metal into at least one rolling slab, wherein the at least one rolling slab has sufficient deformation to achieve substantially uniform recrystallization after annealing in step d);
    c) mechanically or chemically clean surfaces of the at least one rolling slab;
    d) annealing the at least one rolling slab at a sufficient temperature and for a sufficient time to achieve at least partial recrystallization of the at least one rolling slab;
    e) cold or warm rolling the at least one rolling slab in both the perpendicular and parallel directions to the axis of the starting tantalum metal to form at least one plate;
    f) flattening the at least one plate; and
    g) annealing the at least one plate to have an average grain size equal to or less than about 150 microns and a texture substantially void of (100) textural bands;

2. The process of claim 1, wherein said tantalum sputtering component is a sputtering target.

3. The process of claim 2, further comprising attaching a backing plate to said sputtering target.

4. The process of claim 2, wherein said tantalum metal has a purity of at least 99.99% Ta.

5. The process of claim 1, wherein the tantalum metal has a purity of at least 99.50%.

6. The process of claim 1, wherein the flat forging occurs after the tantaluml metal is placed in air for at least about 4 hours and from temperatures ranging from ambient to about 1200° C.

7. The process of claim 1, wherein the cold rolling is transverse rolling at ambient temperatures and the warm rolling is at temperatures of less than about 370° C.

8. The process of claim 1, wherein the annealing of the plate is vacuum annealing at a temperature and for a time sufficient to achieve recrystallization of the tantalum metal.

9. The process of claim 1, wherein said tantalum metal is an ingot.

10. The process of claim 1, wherein said tantalum metal is a 12 inch nominal diameter ingot.

11. The process of claim 1, wherein the tantalum metal has a purity of at least 99.99% Ta.

12. The process of claim 1, wherein said tantalum sputtering component has an average grain size of about 125 microns or less.

13. The process of claim 1, wherein said tantalum sputtering component has an average grain size of 50 microns or less.

14. The process of claim 1, wherein said tantalum sputtering component is fully recrystallized.

15. The process of claim 1, wherein about 80% or more of said tantalum sputtering component is recrystallized.

16. A process of making a sputtering component from tantalum metal, comprising:
   a) mechanically or chemically clean surfaces of the tantalum metal, wherein the tantalum metal has a sufficient starting cross-sectional area to permit steps b) through I);
   b) round forging the tantalum metal into at least one rod, wherein the at least one rod has sufficient deformation to achieve substantially uniform recrystallization after annealing in step d) or step f);
   c) cutting the rod into billets and mechanically or chemically clean the surfaces of the billets;
   d) optionally annealing the billets to achieve at least partial recrystallization;
   e) axially forging billets into preforms;
   f) optionally annealing the preforms to achieve at least partial recrystallization;
   g) cold rolling the preforms into at least one plate; and
   h) optionally mechanically or chemically clean the surfaces of the at least one plate; and
   i) annealing the at least one plate to have an average grain size equal to or less than about 150 microns and a texture substantially void of (100) textural bands, wherein annealing occurs at least in step d) or f) or both.

17. The process of claim 16, wherein said tantalum sputtering component is a sputtering target.

18. The process of claim 16, wherein the tantalum has a purity of at least 99.50%.

19. The process of claim 16, wherein the round forging occurs after subjecting the tantalum metal to temperatures of about 370° C. or lower.

20. The process of claim 16, wherein prior to forging the billets, the billets are annealed.

21. The process of claim 16, wherein prior to cold rolling of the preforms, the preforms are annealed.

22. The process of claim 16, wherein the annealing of the preforms is vacuum annealing at a sufficient temperature and for a time to achieve recrystallization.

23. The process of claim 16, wherein said tantalum metal is an ingot.

24. The process of claim 16, wherein said tantalum metal is a 12 inch nominal diameter ingot 25. The process of claim 16, wherein said tantalum metal has a purity of at least 99.99% Ta.

26. The process of claim 16, further comprising attaching a backing plate to said sputtering target.

27. The process of claim 16, wherein said tantalum sputtering component has an average grain size of about 125 microns or less.

28. The process of claim 16, wherein said tantalum sputtering component has an average grain size of 50 microns or less.

29. The process of claim 16, wherein said tantalum sputtering component is fully recrystallized.

30. The process of claim 16, wherein about 80% or more of said tantalum sputtering component is recrystallized.

* * * * *